United States Patent
Kigure et al.

(10) Patent No.: US 10,151,771 B2
(45) Date of Patent: Dec. 11, 2018

(54) PHYSICAL QUANTITY SENSOR HAVING A FRAME-SHAPED MOVABLE MASS, ELECTRONIC DEVICE, AND MOBILE BODY

(71) Applicant: Seiko Epson Corporation, Tokyo (JP)

(72) Inventors: Shota Kigure, Takasaki (JP); Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 224 days.

(21) Appl. No.: 15/195,055

(22) Filed: Jun. 28, 2016

(65) Prior Publication Data

US 2017/0010300 A1 Jan. 12, 2017

(30) Foreign Application Priority Data

Jul. 10, 2015 (JP) .................... 2015-138780

(51) Int. Cl.
*G01P 15/125* (2006.01)
*B81B 3/00* (2006.01)
*G01P 15/08* (2006.01)

(52) U.S. Cl.
CPC .......... *G01P 15/125* (2013.01); *B81B 3/0072* (2013.01); *B81B 2201/0235* (2013.01); *B81B 2201/033* (2013.01); *B81B 2203/0307* (2013.01); *B81B 2203/051* (2013.01); *G01P 2015/0814* (2013.01)

(58) Field of Classification Search
CPC .......... G01P 15/125; G01P 2015/0814; B81B 3/0072; B81B 2201/0235; B81B 2201/033; B81B 2203/051; B81B 2203/0307
See application file for complete search history.

(56) References Cited

U.S. PATENT DOCUMENTS

| | | | |
|---|---|---|---|
| 5,983,721 A | 11/1999 | Sulzberger et al. | |
| 7,322,242 B2 | 1/2008 | Merassi et al. | |
| 8,207,586 B2 | 6/2012 | Sato et al. | |
| 8,516,890 B2 * | 8/2013 | Rehle .................... | G01P 15/125 73/514.32 |
| 8,796,789 B2 | 8/2014 | Uto et al. | |

(Continued)

FOREIGN PATENT DOCUMENTS

| | | |
|---|---|---|
| JP | H10-111312 A | 4/1998 |
| JP | 2010-071911 A | 4/2010 |
| JP | 2010-117266 A | 5/2010 |

*Primary Examiner* — David Bolduc
(74) *Attorney, Agent, or Firm* — Harness, Dickey & Pierce, P.L.C.

(57) ABSTRACT

A physical quantity sensor includes a movable electrode side fixed section, a first fixed electrode side fixed section which has a first fixed electrode section and a second fixed electrode side fixed section which has a second fixed electrode section, a movable mass section which has a first movable electrode section that has a portion facing the first fixed electrode section and a second movable electrode section that has a portion facing the second fixed electrode section and which is formed in a shape that encloses the movable electrode side fixed section, the first fixed electrode side fixed section, and the second fixed electrode side fixed section in planar view, and an elastic section which connects the movable electrode side fixed section and the movable mass section.

20 Claims, 12 Drawing Sheets

(56) References Cited

U.S. PATENT DOCUMENTS

| | | | | |
|---|---|---|---|---|
| 2003/0155622 A1* | 8/2003 | Ishibashi | B81B 7/007 | 257/414 |
| 2004/0025591 A1* | 2/2004 | Yoshikawa | G01P 15/125 | 73/514.32 |
| 2006/0032310 A1* | 2/2006 | Merassi | B81B 7/0048 | 73/514.35 |
| 2009/0140356 A1* | 6/2009 | Yazdi | B81C 1/00253 | 257/415 |
| 2009/0314085 A1* | 12/2009 | Stahl | G01P 15/125 | 73/514.32 |
| 2009/0320596 A1* | 12/2009 | Classen | G01P 15/125 | 73/514.32 |
| 2010/0024549 A1* | 2/2010 | Wang | G01P 15/0802 | 73/504.14 |
| 2010/0072563 A1* | 3/2010 | Sato | B81B 7/007 | 257/415 |
| 2011/0296916 A1* | 12/2011 | Ge | G01P 15/125 | 73/514.32 |
| 2012/0160029 A1* | 6/2012 | Yamaguchi | G01P 15/125 | 73/514.32 |
| 2015/0316581 A1* | 11/2015 | Liukku | B81B 3/0078 | 73/514.32 |
| 2016/0356806 A1* | 12/2016 | Malvern | G01P 15/125 | |

\* cited by examiner

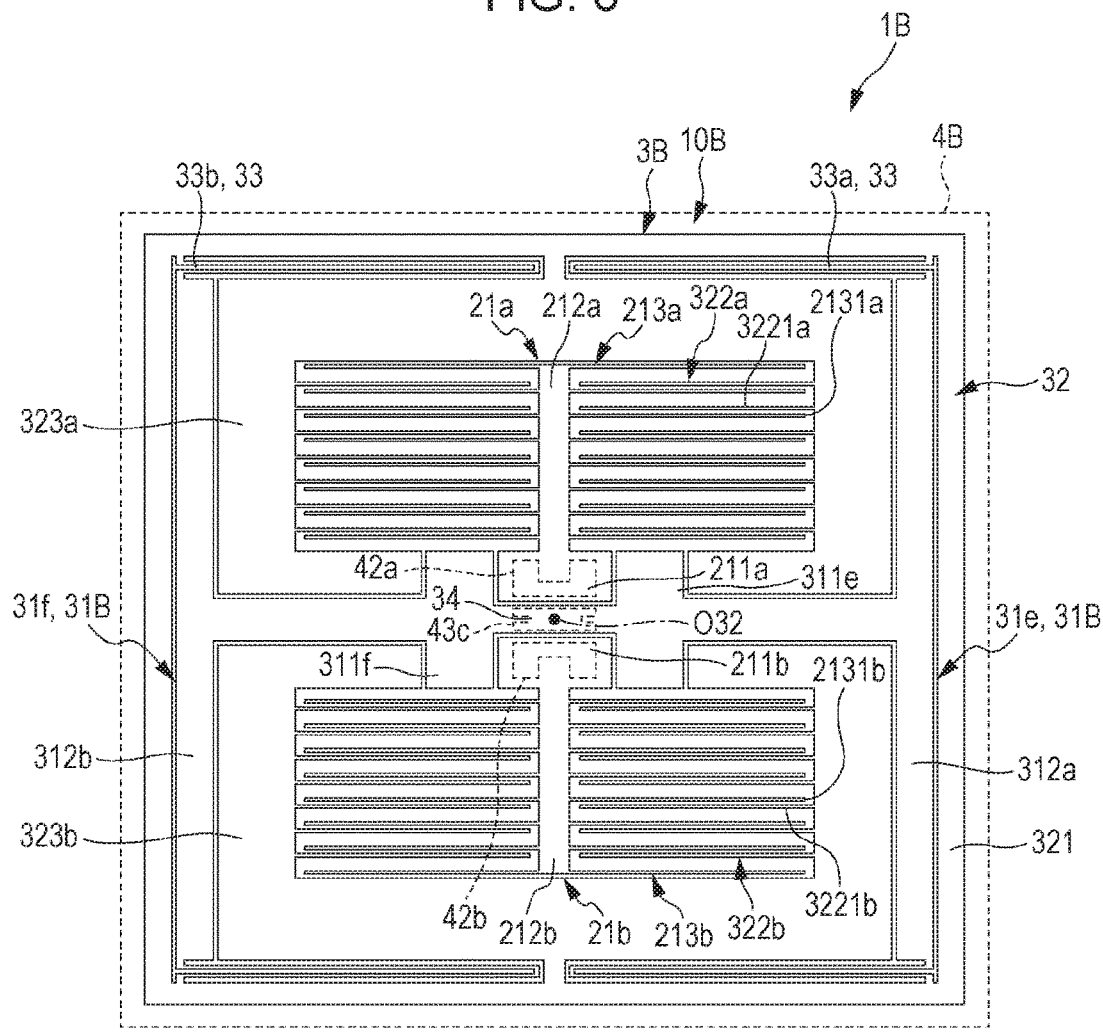
FIG. 8
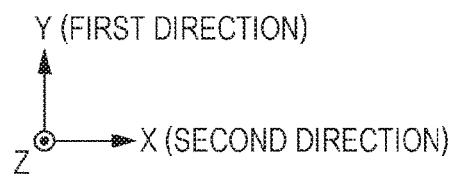

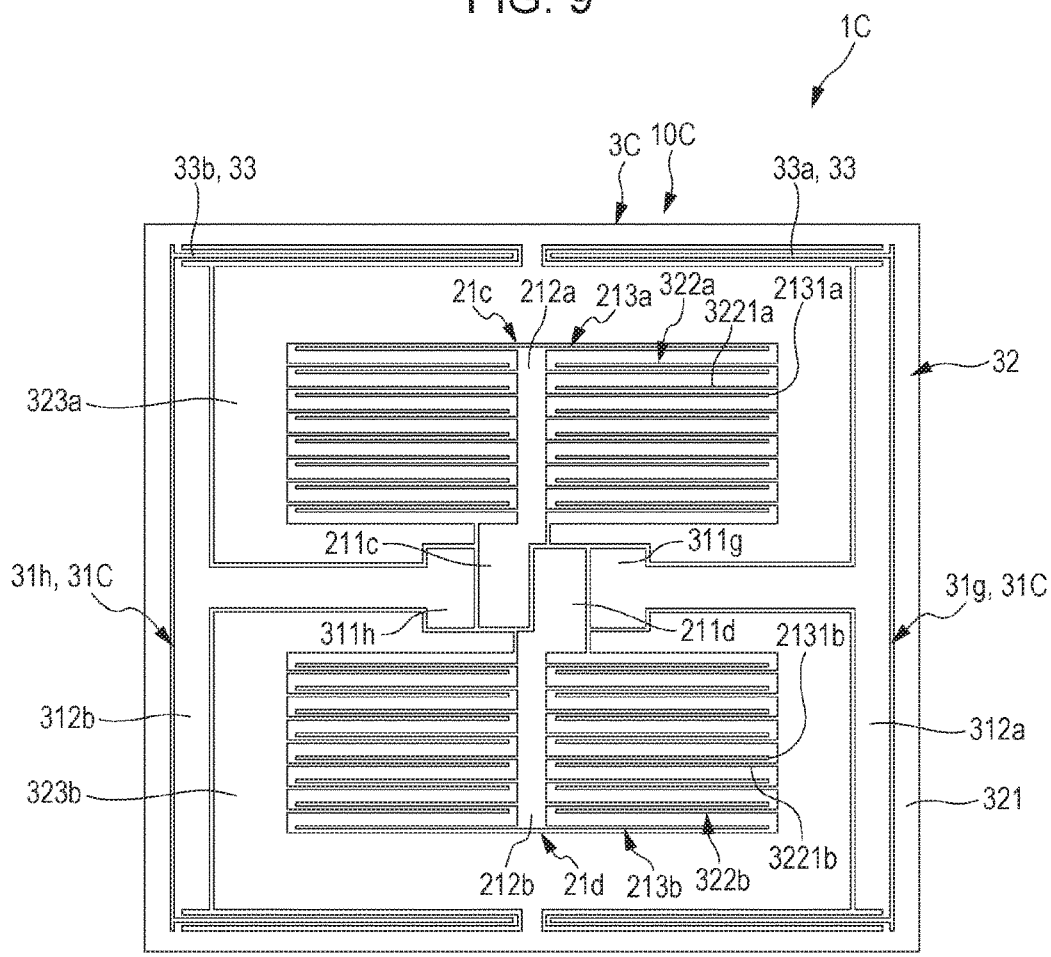
FIG. 9
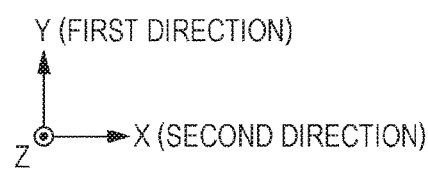

PHYSICAL QUANTITY SENSOR HAVING A FRAME-SHAPED MOVABLE MASS, ELECTRONIC DEVICE, AND MOBILE BODY

BACKGROUND

1. Technical Field

The present invention relates to a physical quantity sensor, an electronic device, and a mobile body.

2. Related Art

In recent years, a sensor has been developed that is manufactured using a silicon micro electro mechanical systems (MEMS) technique. As such a sensor, an electrostatic capacitive-type physical quantity sensor is known which has a fixed electrode that is disposed to be fixed and a movable electrode which faces the fixed electrode with an interval therebetween and is provided to be displaceable, and detects a physical quantity such as acceleration and angular velocity based on electrostatic capacity between the two electrodes (for example, refer to JP-A-2010-071911).

For example, the physical quantity sensor in JP-A-2010-071911 has two fixed electrode sections and a movable electrode section which are formed separated from one silicon wafer. In the physical quantity sensor, each fixed electrode section has a support conducting section which is fixed to a substrate front surface, an electrode support section with a fixed width dimension which extends linearly from the support conducting section, and a plurality of opposing electrodes which are arranged to form a comb-tooth shape extending from the electrode support section. Meanwhile, the movable electrode section has two support conducting portions which are fixed to the substrate front surface, support arm portions which extend from respective support conducting portions, a weight section which is disposed in a region interposed by two support arm sections, an elastic support section which supports the weight section with respect to each support arm section, and a plurality of movable opposing electrodes which are disposed extending from the weight section so as to face the plurality of opposing electrodes of the fixed electrode section described above.

In such a physical quantity sensor in the related art, the movable electrode and the fixed electrode are fixed and connected to a substrate via a plurality of connecting sections (support conducting section in JP-A-2010-071911), but a portion of the movable electrode (weight section in JP-A-2010-071911) is positioned in planar view between the plurality of connecting sections. For this reason, in the physical quantity sensor in the related art, it is difficult to shorten a distance between the plurality of connecting sections and when the substrate is warped accompanying temperature variance, the warping of the substrate is likely to influence the fixed electrode and movable electrode via the connecting section to be deformed, and as a result, there is a problem in that temperature characteristics deteriorate. Here, for example, the warping of the substrate accompanying temperature variance occurs due to a linear expansion coefficient difference between the substrate and a member which is joined to the substrate (for example, a structure that includes the movable electrode and the fixed electrode, or a lid member for configuring a package which accommodates the substrate and the structure).

SUMMARY

An advantage of some aspects of the invention is to provide a physical quantity sensor with superior temperature characteristics, and provide an electronic device and a mobile body that include the physical quantity sensor.

The advantage is achieved by the aspects of the invention below.

According to an aspect of the invention, there is provided a physical quantity sensor including a movable electrode side fixed section, a first fixed electrode side fixed section which has a first fixed electrode section and a second fixed electrode side fixed section which has a second fixed electrode section, the first fixed electrode side fixed section and the second fixed electrode side fixed section being arranged along a first direction, a movable mass section which has a first movable electrode section that has a portion facing the first fixed electrode section and a second movable electrode section that has a portion facing the second fixed electrode section and which is formed in a shape that encloses the movable electrode side fixed section, the first fixed electrode side fixed section, and the second fixed electrode side fixed section in planar view, and an elastic section which connects the movable electrode side fixed section and the movable mass section such that the movable mass section is displaceable in the first direction.

According to such a physical quantity sensor, even in a case where the substrate on which the first fixed electrode side fixed section, the second fixed electrode side fixed section, and the movable electrode side fixed section are fixed is warped accompanying temperature variance and the warping influences the fixed electrode section (first fixed electrode section and second fixed electrode section) or the movable electrode section, it is possible to reduce a deformation difference between electrode sections by forming the movable mass section as a frame body, and disposing the first fixed electrode side fixed section, the second fixed electrode side fixed section, and the movable electrode side fixed section inside the movable mass section in planar view. As a result, it is possible to achieve superior temperature characteristics. Moreover, it is possible to shorten a distance between respective fixed electrode sections by forming the movable electrode section as a frame body and disposing two fixed electrode sections along the first direction which is the same direction as a direction (detection axis direction) in which the movable mass section is displaced. As a result, it is possible to provide a physical quantity sensor with higher sensitivity.

In the physical quantity sensor, it is preferable that the first movable electrode section has a plurality of first movable electrode fingers which extend along a second direction which intersects with the first direction, the second movable electrode section has a plurality of second movable electrode fingers which extend along the second direction, the first fixed electrode section has a plurality of first fixed electrode fingers which extend along the second direction, and the second fixed electrode section has a plurality of second fixed electrode fingers which extend along the second direction.

Thereby, it is possible to increase electrostatic capacity change between the first fixed electrode section and the first movable electrode section and between the second fixed electrode section and the second movable electrode section accompanying displacement of the movable mass section. For this reason, it is possible to achieve the physical quantity sensor with high sensitivity.

In the physical quantity sensor, it is preferable that the first fixed electrode side fixed section has a first extending section which extends along the first direction and supports the plurality of first fixed electrode fingers, and the second fixed electrode side fixed section has a second extending section which extends along the first direction and supports the plurality of second fixed electrode fingers.

Thereby, it is possible to effectively increase the number of fixed electrode fingers and movable electrode fingers. For this reason, it is possible to further increase electrostatic capacity change between the first fixed electrode section and the first movable electrode section and between the second fixed electrode section and the second movable electrode section accompanying displacement of the movable mass section.

In the physical quantity sensor, it is preferable that the first extending section is disposed on one side in the first direction with respect to the movable electrode side fixed section, and the second extending section is disposed on the other side in the first direction with respect to the movable electrode side fixed section.

Thereby, it is possible to reduce noise by carrying out a differential calculation of a signal according to electrostatic capacity change between the first fixed electrode section and the first movable electrode section and a signal according to electrostatic capacity change between the second fixed electrode section and the second movable electrode section.

The physical quantity sensor preferably further includes a substrate, a first fixed electrode side wiring provided on the substrate and electrically connected to the first fixed electrode fingers, and a second fixed electrode side wiring provided on the substrate and electrically connected to the second fixed electrode fingers, in which the first extending section preferably has a portion which overlaps with the first fixed electrode side wiring in planar view, and the second extending section preferably has a portion which overlaps with the second fixed electrode side wiring in planar view.

Thereby, since the extending section and the fixed electrode side wiring have the same potential as each other, it is possible to reduce parasitic capacitance which occurs between the substrate and each extending section with the extending section and the fixed electrode side wiring overlapping with each other in planar view. As a result, it is possible to achieve superior detection characteristics of the physical quantity sensor.

The physical quantity sensor preferably further includes a substrate and a movable electrode side wiring provided on the substrate and electrically connected respectively to the first movable electrode fingers and the second movable electrode fingers, in which respective tip end sections of the first movable electrode fingers and the second movable electrode fingers preferably overlap with the movable electrode side wiring in planar view.

Thereby, when the structure which includes the movable electrode side fixed section and the substrate are anodically bonded, since the tip end section of the movable electrode finger faces the movable electrode side wiring with the same potential as the tip end section, an electric field is reduced which is generated between the tip end section of the movable electrode finger and the substrate, and as a result, it is possible to prevent or reduce sticking of each movable electrode finger on the substrate.

The physical quantity sensor preferably further includes a projecting section which is provided on a main surface of the substrate overlapping with the movable mass section in planar view.

Thereby, it is possible to regulate movement in an out-of-plane direction of the movable mass section using the projecting section, and as a result, it is possible to prevent or reduce sticking of the movable mass section on the substrate.

In the physical quantity sensor, it is preferable that the movable electrode side fixed section has a first movable electrode side fixed section and a second movable electrode side fixed section which are disposed lined up along a second direction which intersects with the first direction.

In this manner, it is possible to dispose two fixed electrode side fixed sections close to each other between the first movable electrode side fixed section and the second movable electrode side fixed section in planar view by dividing the movable electrode side fixed section into the first movable electrode side fixed section and the second movable electrode side fixed section. For this reason, it is possible to shorten a distance between the two fixed electrode side fixed sections, and as a result, it is possible to achieve further superior temperature characteristics.

In the physical quantity sensor, it is preferable that a separation distance between the first movable electrode side fixed section and the second movable electrode side fixed section is shorter than a separation distance between the first fixed electrode side fixed section and the second fixed electrode side fixed section.

Thereby, when the substrate is warped in the second direction, it is possible to reduce the influence of warping of the substrate on the first movable electrode side fixed section and the second movable electrode side fixed section. As a result, it is possible to achieve further superior temperature characteristics.

In the physical quantity sensor, it is preferable that a separation distance between the first movable electrode side fixed section and the second movable electrode side fixed section is longer than a separation distance between the first fixed electrode side fixed section and the second fixed electrode side fixed section.

Thereby, when the substrate is warped in the first direction, it is possible to reduce the influence of warping of the substrate on the first fixed electrode side fixed section and the second fixed electrode side fixed section. As a result, it is possible to achieve further superior temperature characteristics.

In the physical quantity sensor, it is preferable that the elastic section has a first elastic section which connects the first movable electrode side fixed section and the movable mass section such that the movable mass section is displaceable in the first direction and a second elastic section which connects the second movable electrode side fixed section and the movable mass section such that the movable mass section is displaceable in the first direction.

Thereby, it is possible to more stably support the movable mass section, and consequently, it is possible to improve characteristics of the physical quantity sensor.

In the physical quantity sensor, it is preferable that the movable electrode side fixed section has a first support section that has a portion which extends along the second direction that intersects with the first direction, and a second support section that has a portion which extends along the second direction at the opposite side from the first support section, the first elastic section is connected to the first support section and the second elastic section is connected to the second support section.

Thereby, it is possible to increase a distance between a connecting portion of the first support section and a first connecting section and a connecting portion of the second support section and a second connecting section. For this reason, it is possible to reduce displacement in the out-of-plane direction of the movable mass section and reduce torsional vibration within a plane in which the out-of-plane direction is set as an axis. For this reason, it is possible to improve impact resistance of the physical quantity sensor.

In the physical quantity sensor, it is preferable that the movable electrode side fixed section has a portion which is positioned between the first fixed electrode side fixed section and the second fixed electrode side fixed section in planar view.

Thereby, it is possible to dispose the movable electrode side fixed section with a portion (connecting section) of the movable electrode side fixed section, which is connected to the substrate, being concentrated on one point on a center of gravity of the movable mass section or in the vicinity of the center of gravity. As a result, it is possible to reduce the influence of warping of the substrate on the movable electrode side fixed section, and consequently, it is possible to achieve further superior temperature characteristics.

In the physical quantity sensor, it is preferable that the movable electrode side fixed section has a portion which overlaps with the center of gravity of the movable mass section in planar view.

Thereby, it is possible to dispose the movable electrode side fixed section with a portion (connecting section) of the movable electrode side fixed section, which is connected to the substrate, being concentrated on one point on the center of gravity of the movable mass section or in the vicinity of the center of gravity. As a result, it is possible to reduce the influence of warping of the substrate on the movable electrode side fixed section, and consequently, it is possible to achieve further superior temperature characteristics.

According to another aspect of the invention, there is provided an electronic device including the physical quantity sensor.

According to such an electronic device, since the physical quantity sensor has superior temperature characteristics, it is possible to increase reliability.

According to still another aspect of the invention, there is provided a mobile body including the physical quantity sensor.

According to such a mobile body, since the physical quantity sensor has superior temperature characteristics, it is possible to increase reliability.

BRIEF DESCRIPTION OF THE DRAWINGS

The invention will be described with reference to the accompanying drawings, wherein like numbers reference like elements.

FIG. 8 is a planar view illustrating a physical quantity sensor according to a third embodiment of the invention.

FIG. 9 is a planar view illustrating a physical quantity sensor according to a fourth embodiment of the invention.

DESCRIPTION OF EXEMPLARY EMBODIMENTS

Figure 1:
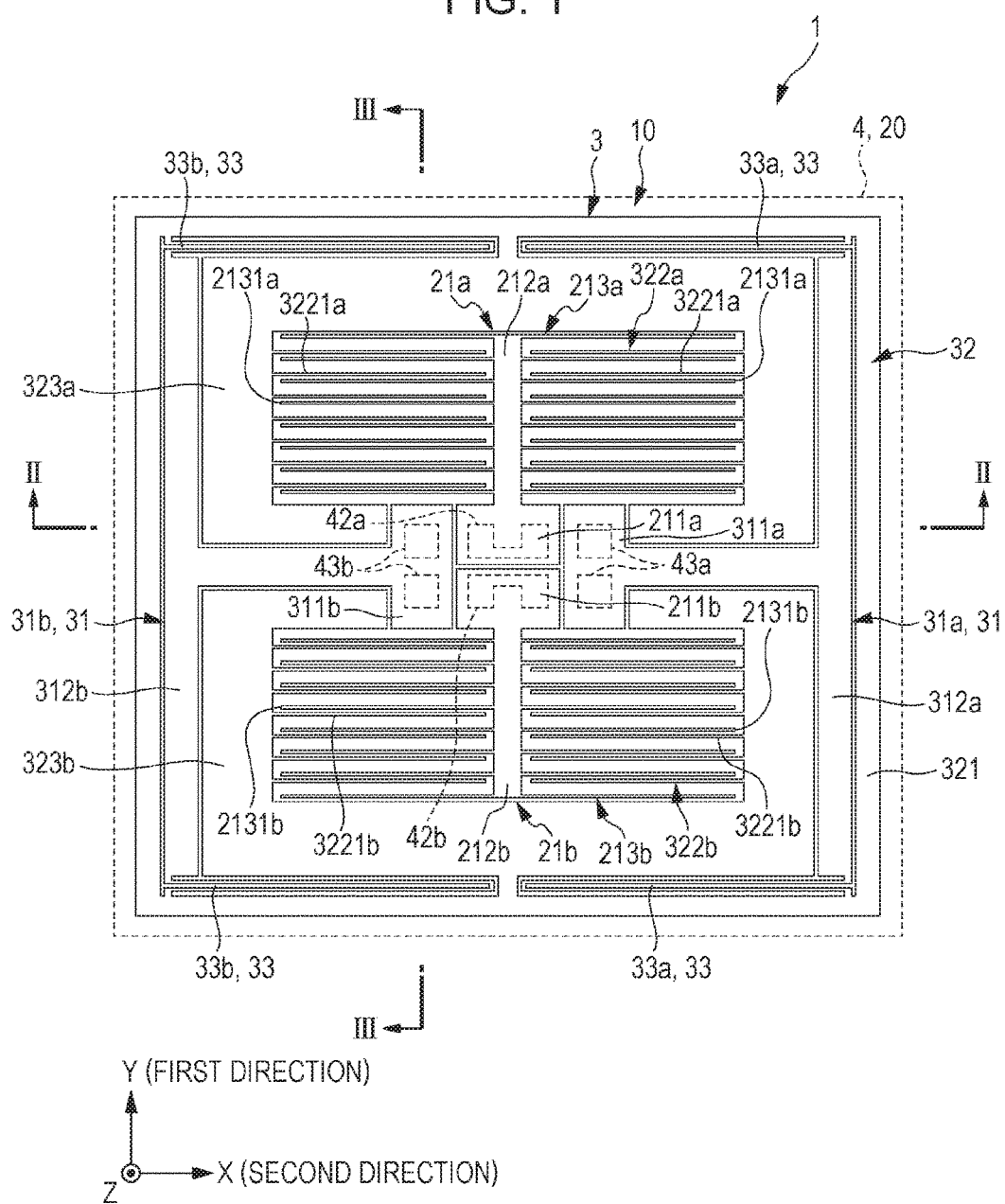
FIG. 1 is a planar view illustrating a physical quantity sensor according to a first embodiment of the invention.

A physical quantity sensor, an electronic device, and a mobile body of the invention will be described below in detail based on the embodiments which are illustrated in the drawings.

1. Physical Quantity Sensor

First, the physical quantity sensor of the invention will be described.

First Embodiment

Figure 2:
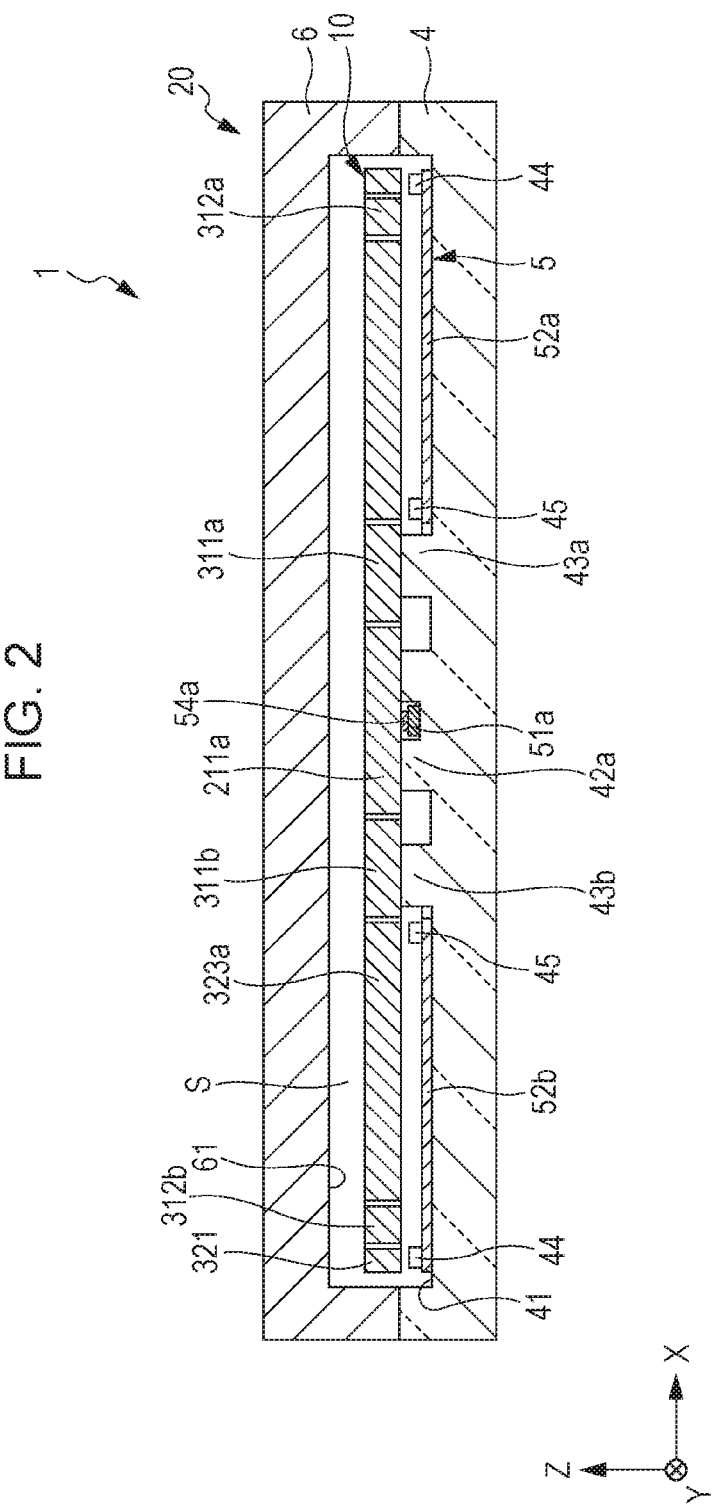
FIG. 2 is a sectional view taken along line II-II in FIG. 1.
Figure 3:
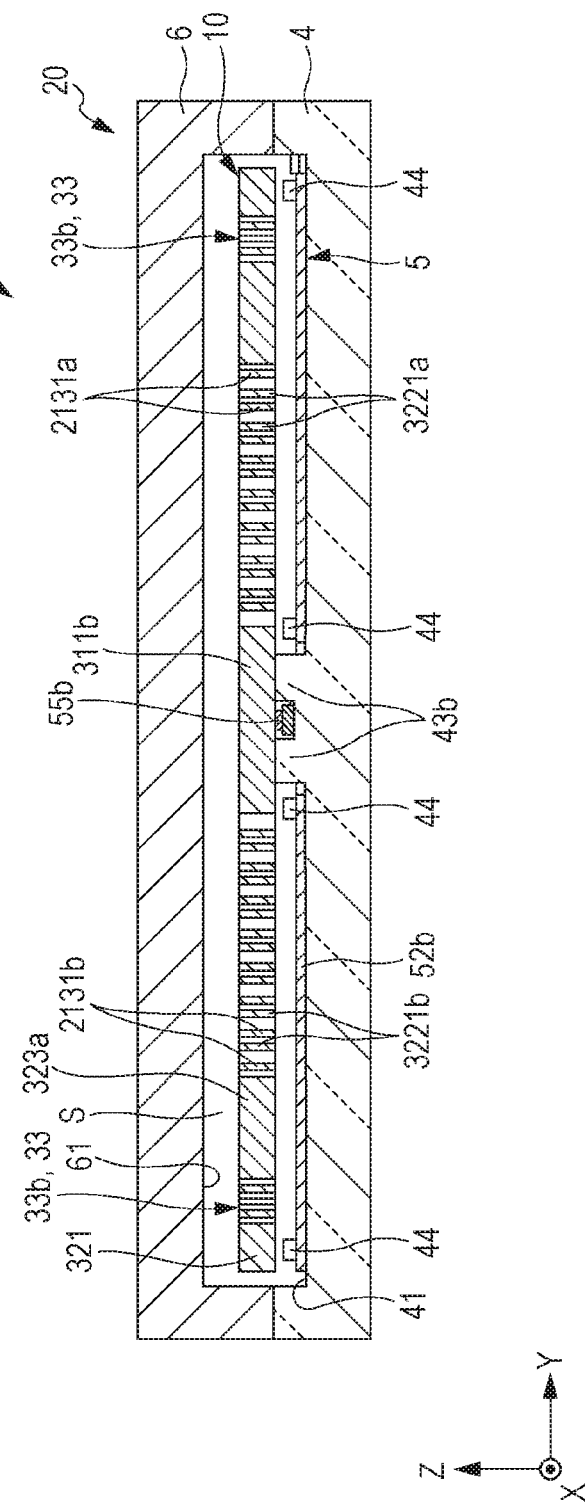
FIG. 3 is a sectional view taken along line III-III in FIG. 1.
Figure 4:
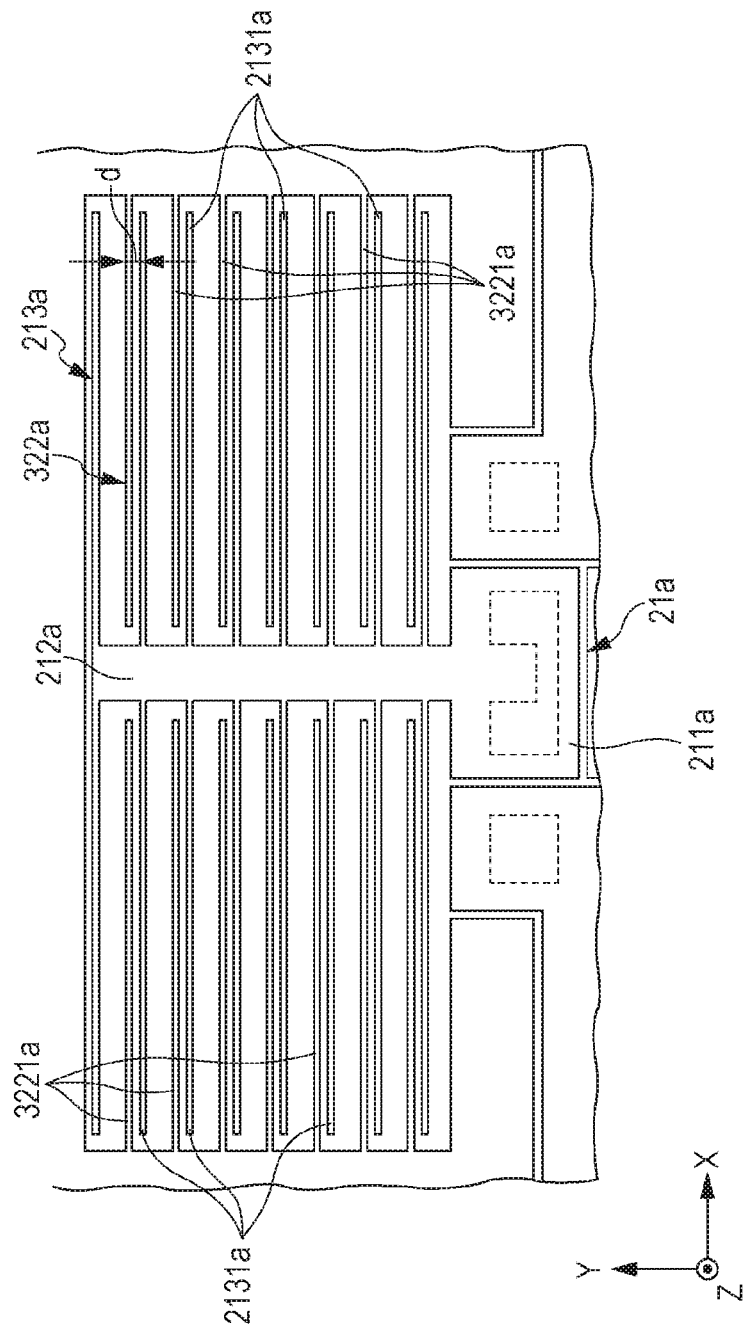
FIG. 4 is a partial expanded planar view for describing a first fixed electrode section and a first movable electrode section which are provided in the physical quantity sensor illustrated in FIG. 1.
Figure 5:
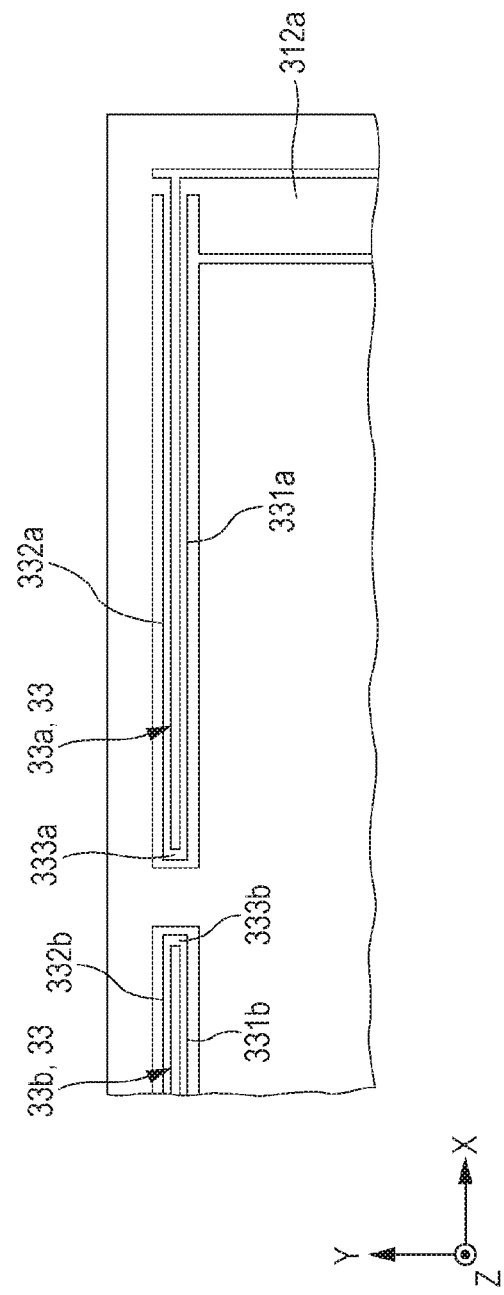
FIG. 5 is a partial expanded planar view for describing a first elastic section which is provided in the physical quantity sensor illustrated in FIG. 1.
Figure 6:
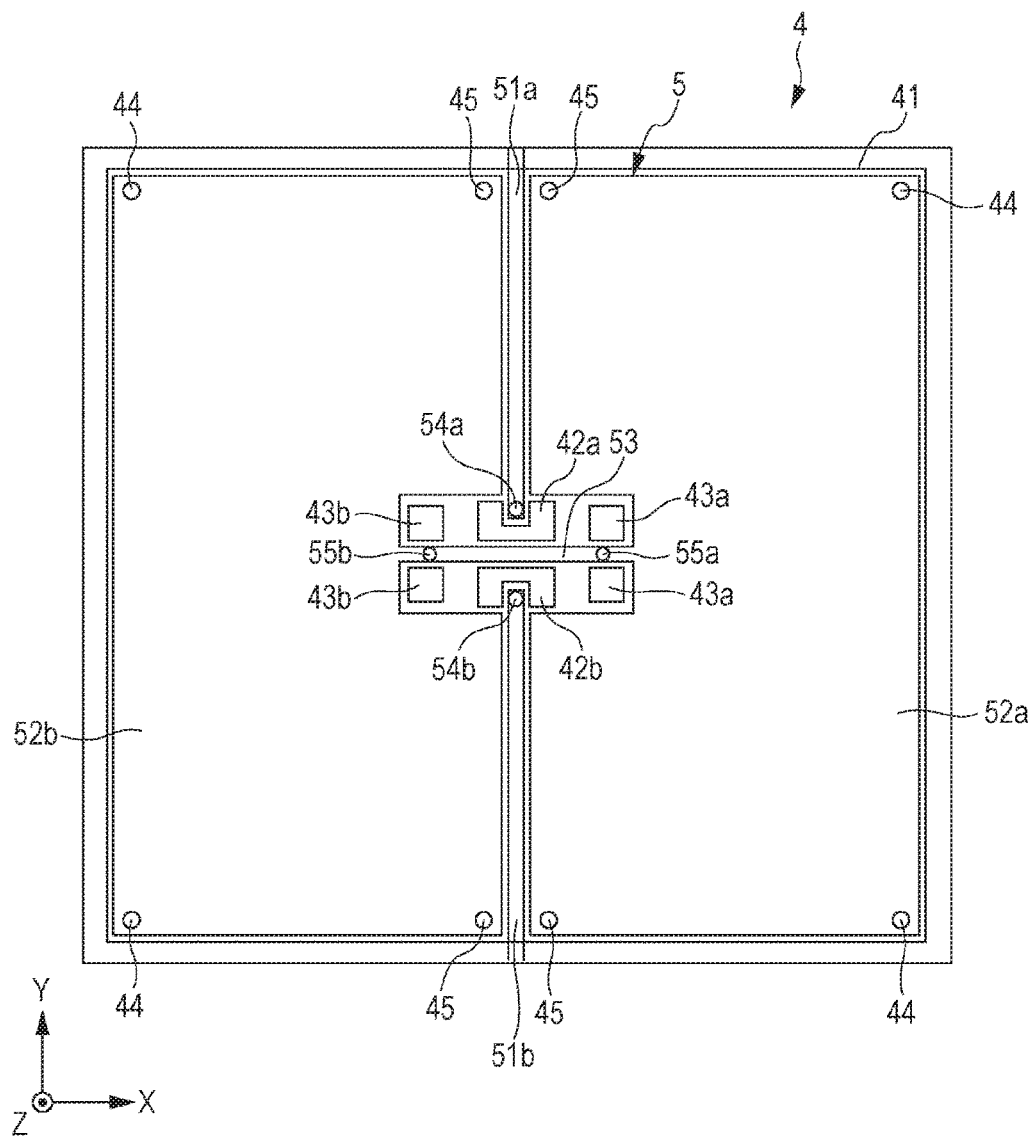
FIG. 6 is a planar view for describing a support substrate and a wiring pattern which are provided in the physical quantity sensor illustrated in FIG. 1.

FIG. 1 is a planar view illustrating a physical quantity sensor according to a first embodiment of the invention, FIG. 2 is a sectional view taken along line II-II in FIG. 1, and FIG. 3 is a sectional view along line III-III in FIG. 1. FIG. 4 is a partial expanded planar view for describing a first fixed electrode section and a first movable electrode section which are provided with the physical quantity sensor illustrated in FIG. 1. FIG. 5 is a partial expanded planar view for describing a first elastic section which is provided with the physical quantity sensor illustrated in FIG. 1. FIG. 6 is a planar view for describing a support substrate and a wiring pattern which are provided with the physical quantity sensor illustrated in FIG. 1.

Here, in each diagram, for convenience of explanation, an X axis, a Y axis, and a Z axis which are three axes which are orthogonal to each other are illustrated as arrows, the tip end side of the arrows are set as "+(plus)" and the base end side is set as "− (minus)". In addition, hereinafter a direction (second direction) which is parallel to the X axis is referred to as an "X axis direction", a direction (first direction) which is parallel to the Y axis is referred to as a "Y axis direction", and a direction which is parallel to the Z axis is referred to as a "Z axis direction". In addition, for convenience of explanation, hereinafter an upper side (+Z axis direction side) in FIG. 2 and FIG. 3 is set as "upper", and a lower side (−Z axis direction side) is set as "lower".

As shown in FIGS. 1 to 3, the physical quantity sensor 1 of the embodiment has a sensor element 10, a substrate 4 which supports the sensor element 10, a wiring pattern 5 which is electrically connected to the sensor element 10 on the substrate 4, and a lid member 6 which is joined to the substrate 4 so as to cover the sensor element 10. Here, the substrate 4 and the lid member 6 configure a package 20 that forms a space S in which the sensor element 10 is stored. Each section of the physical quantity sensor 1 will be described below in order.

Sensor Element 10

As shown in FIG. 1, the sensor element 10 has a first fixed electrode side fixed section 21a, a second fixed electrode side fixed section 21b, and a movable electrode side fixed section 31 which are fixed to the substrate 4, a movable mass section 32 which encloses the fixed sections in planar view, and an elastic section 33 which is connected to the movable electrode side fixed section 31 and the movable mass section 32.

Here, the movable electrode side fixed section 31, the movable mass section 32, and the elastic section 33 are integrally formed and configure a movable electrode side structure 3. That is, the sensor element 10 has the first fixed electrode side fixed section 21a, the second fixed electrode side fixed section 21b, and the movable electrode side structure 3 which are disposed at intervals with a gap from each other, and the movable electrode side structure 3 has the movable electrode side fixed section 31, the movable mass section 32, and the elastic section 33 which are integrally formed. In addition, the movable electrode side fixed section 31 has a first movable electrode side fixed section 31a and a second movable electrode side fixed section 31b. In addition, the elastic section 33 has two first elastic sections 33a and two second elastic sections 33b. Here, in the embodiment, the sensor element 10 has a form with rotational symmetry in planar view, and has a symmetrical form in relation to the X axis direction and the Y axis direction.

The first fixed electrode side fixed section 21a and the second fixed electrode side fixed section 21b are disposed lined up along the Y axis direction. Here, the first fixed electrode side fixed section 21a is disposed on the +Y axis direction side with respect to the center of the sensor element 10, and meanwhile, the second fixed electrode side fixed section 21b is disposed on the −Y axis direction side with respect to the center of the sensor element 10.

The first fixed electrode side fixed section 21a has a connecting section 211a which is connected to the substrate 4, a first extending section 212a which extends from the connecting section 211a along the +Y axis direction, and a first fixed electrode section 213a which is connected to the first extending section 212a. The first fixed electrode section 213a is configured by a plurality of first fixed electrode fingers 2131a which are supported by an end in the first extending section 212a (refer to FIG. 4). The plurality of first fixed electrode fingers 2131a extend along respective directions of the +X axis direction and the −X axis direction from the first extending section 212a and are disposed lined up at intervals with a gap along the Y axis direction, and configure the "first fixed electrode comb section" which has a comb-tooth shape.

In the same manner, the second fixed electrode side fixed section 21b has a connecting section 211b which is connected to the substrate 4, a second extending section 212b which extends from the connecting section 211b along the −Y axis direction, and a second fixed electrode section 213b which is connected to the second extending section 212b. The second fixed electrode section 213b is disposed lined up along the Y axis direction with respect to the first fixed electrode section 213a described above, and is configured by a plurality of second fixed electrode fingers 2131b which are supported by an end on the second extending section 212b. The plurality of second fixed electrode fingers 2131b extend along respective directions of the +X axis direction and the −X axis direction from the second extending section 212b and are disposed lined up at intervals with a gap along the Y axis direction, and configure the "second fixed electrode comb section" which has a comb-tooth shape.

Meanwhile, the first movable electrode side fixed section 31a and the second movable electrode side fixed section 31b are disposed lined up along the X axis direction which intersects with the Y axis direction. Here, the first movable electrode side fixed section 31a is disposed on the +X axis direction side with respect to center of the sensor element 10, and meanwhile, the second movable electrode side fixed section 31b is disposed on the −X axis direction side with respect to the center of the sensor element 10. In the embodiment, in planar view, the first movable electrode side fixed section 31a is disposed in the +X axis direction and the second movable electrode side fixed section 31b is disposed in the −X axis direction with respect to the connecting sections 211a and 211b. Accordingly, the first fixed electrode side fixed section 21a and the second fixed electrode side fixed section 21b respectively have a portion (connecting sections 211a and 211b) which are positioned between the first movable electrode side fixed section 31a and the second movable electrode side fixed section 31b in planar view.

The first movable electrode side fixed section 31a has the connecting section 311a which is connected to the substrate 4 and a first support section 312a which connects to the connecting section 311a. The first support section 312a has a T shape in planar view, and has a portion which extends from the connecting section 311a along the +X axis direction, and a portion which extends from the end section opposite to the connecting section 311a of the portion along the respective directions of the +Y axis direction and the −Y axis direction.

In the same manner, the second movable electrode side fixed section 31b has the connecting section 311b which is connected to the substrate 4 and a second support section 312b which connects to the connecting section 311b. The second support section 312b has a T shape in planar view, and has a portion which extends from the connecting section 311b along the −X axis direction, and a portion which extends from the end section opposite to the connecting section 311b of the portion along the respective directions of the +Y axis direction and the −Y axis direction.

In this manner, the first fixed electrode side fixed section 21a, the second fixed electrode side fixed section 21b, and the movable electrode side fixed section 31 are disposed inside the movable mass section 32 which is a frame shape in planar view. In other words, in planar view, the movable mass section 32 has a shape which is enclosed by the first fixed electrode side fixed section 21a, the second fixed electrode side fixed section 21b, and the movable electrode side fixed section 31.

The movable mass section 32 has a frame section 321 which is a frame shape in planar view, a first weight section 323a and a second weight section 323b which are connected to the frame section 321, a first movable electrode section 322a which is connected to the first weight section 323a, and a second movable electrode section 322b which is connected to the second weight section 323b.

The frame section 321 is configured by an outer edge section of the sensor element 10, and as described above, the first fixed electrode side fixed section 21a, the second fixed electrode side fixed section 21b, and the movable electrode side fixed section 31 are disposed inside the frame section 321.

The first weight section 323a is connected to the frame section 321 inside the frame section 321, and is formed so as to enclose the periphery of the first fixed electrode side fixed section 21a (mainly the first fixed electrode section 213a) in planar view. Meanwhile, the second weight section 323b is connected to the frame section 321 inside the frame section 321, and is formed so as to enclose the periphery of the second fixed electrode side fixed section 21b (mainly the second fixed electrode section 213b) in planar view.

Here, the first movable electrode section 322a has a portion which faces the first fixed electrode section 213a described above. In detail, the first movable electrode section 322a is configured by a plurality of first movable electrode fingers 3221a which are disposed extending from the first weight section 323a so as to mesh with a gap d at intervals with respect to the plurality of first fixed electrode fingers 2131a (first fixed electrode comb section) of the first fixed electrode section 213a described above and in which an end is supported on the first weight section 323a (refer to FIG. 4). The plurality of first movable electrode fingers 3221a extend along the X axis direction from the first weight section 323a and are disposed lined up at intervals with a gap along the Y axis direction, and configure the "first movable electrode comb section" which has a comb-tooth shape.

In the same manner, the second movable electrode section 322b has a portion which faces the second fixed electrode section 213b described above. In detail, the second movable electrode section 322b is configured by a plurality of second movable electrode fingers 3221b which is disposed extending from the second weight section 323b so as to mesh with a gap at intervals with respect to the plurality of second electrode fingers 2131b of the second fixed electrode section 213b described above and in which an end is supported on the second weight section 323b. The plurality of second movable electrode fingers 3221b extend along the X axis direction from the second weight section 323b and are disposed lined up at intervals with a gap along the Y axis direction, and configure the "second movable electrode comb section" which has a comb-tooth shape.

Such a movable mass section 32 is supported via two first elastic sections 33a with respect to the first movable electrode side fixed section 31a described above, and is supported via two second elastic sections 33b with respect to the second movable electrode side fixed section 31b described above. Accordingly, in planar view, not only the first fixed electrode side fixed section 21a, the second fixed electrode side fixed section 21b, the first movable electrode side fixed section 31a, and the second movable electrode side fixed section 31b described above, but two first elastic sections 33a and the two second elastic sections 33b are also disposed inside the frame section 321 which is a frame shape.

Two first elastic sections 33a are respectively connected to the first movable electrode side fixed section 31a and the movable mass section 32 in which the movable mass section 32 is displaceable in the Y axis direction. One first elastic section 33a out of the two first elastic sections 33a is connected to an end section on the +Y axis direction side of the first support section 312a which has the first movable electrode side fixed section 31a, and the other first elastic section 33a is connected to the end section on the −Y axis direction side of the first support section 312a. In the same manner, two second elastic sections 33b are respectively connected to the second movable electrode side fixed section 31b and the movable mass section 32 in which the movable mass section 32 is displaceable in the Y axis direction. One second elastic section 33b out of the two second elastic sections 33b is connected to an end section on the +Y axis direction side of the second support section 312b which has the second movable electrode side fixed section 31b, and the other second elastic section 33b is connected to the end section on the −Y axis direction side of the second support section 312b.

The first elastic section 33a which is connected to the end section on the +Y axis direction side of the first support section 312a and the second elastic section 33b which is connected to the end section on the +Y axis direction side of the second support section 312b are formed to respectively extend in the Y axis direction while meandering such that approach and separation are repeated with each other in the X axis direction. In the same manner, the first elastic section 33a which is connected to the end section on the −Y axis direction side of the first support section 312a and the second elastic section 33b which is connected to the end section on the −Y axis direction side of the second support section 312b are formed to respectively extend in the Y axis direction while meandering such that approach and separation are repeated with each other in the X axis direction.

As shown in FIG. 5, the first elastic section 33a has a portion 331a (beam) and a portion 332a (beam) which extends along the X axis direction and a portion 333a (linking section) which is linked to each end section of the portions 331a and 332a. In the same manner, the second elastic section 33b has a portion 331b (beam) and a portion 332b (beam) which extends along the X axis direction and a portion 333b (linking section) which is linked to each end section of the portions 331b and 332b.

Here, if the shape of the first elastic section 33a and the second elastic section 33b is able to displace the movable mass section 32 in the Y axis direction, the shape is not limited to the description above, for example, may be configured by one beam which extends along the X axis direction, and may be configured by three or more beams and two or more linking sections which link with the beams.

The configuration material of the first fixed electrode side fixed section 21a, the second fixed electrode side fixed section 21b, and the movable electrode side structure 3 as described above are respectively not particularly limited, but for example, it is preferable that a silicon material (such as single crystal silicon or polysilicon) to which conductivity is imparted by impurities such as phosphorus and boron being doped.

In addition, the first fixed electrode side fixed section 21a, the second fixed electrode side fixed section 21b, and the movable electrode side structure 3 are able to collectively form one substrate (for example, silicon substrate) by etching. In this case, it is possible to simply and with high precision align the thickness of each section of the sensor element 10. In addition, it is possible to process silicon with high precision by etching.

In the sensor element 10 which is configured as described above, when acceleration in the Y axis direction which is a detection axis direction is received by the sensor element 10, the movable mass section 32 is displaced in the Y axis direction accompanying elastic deformation of the first elastic section 33a and the second elastic section 33b. By doing this, a distance between the first fixed electrode fingers 2131a of the first fixed electrode section 213a and the first movable electrode fingers 3221a of the first movable electrode section 322a, and a distance between the second fixed electrode fingers 2131b of the second fixed electrode section 213b and the second movable electrode fingers 3221b of the second movable electrode section 322b are respectively changed.

Accordingly, it is possible to detect the size of acceleration which is received by the sensor element 10 based on electrostatic capacity between the distances. In the embodiment, out of a distance between the first fixed electrode fingers 2131a and the first movable electrode fingers 3221a and a distance between the second fixed electrode fingers 2131b and the second movable electrode fingers 3221b, one distance is large, and the other distance is small. For this reason, out of electrostatic capacity between the first fixed electrode fingers 2131a and the first movable electrode fingers 3221a and electrostatic capacity between the second fixed electrode fingers 2131b and the second movable electrode fingers 3221b, one electrostatic capacity is large, and the other electrostatic capacity is small. Accordingly, differential calculation is carried out on a signal based on electrostatic capacity between the first fixed electrode fingers 2131a of the first fixed electrode section 213a and the first movable electrode fingers 3221a of the first movable electrode section 322a, and a signal based on electrostatic capacity between the second fixed electrode fingers 2131b of the second fixed electrode section 213b and the second movable electrode fingers 3221b of the second movable electrode section 322b. Thereby, it is possible to reduce noise by removing a signal component accompanying displacement of the movable mass section 32 outside the detection signal axis direction, and output a signal according to acceleration which is received by the sensor element 10.

Substrate

The substrate 4 (support substrate) has a plate form, and is disposed along the XY horizontal plane (reference surface) which is a horizontal plane that includes the X axis and the Y axis. As shown in FIGS. 2 and 3, a concave section 41 is provided on an upper surface (surface of a side on which the sensor element 10 is provided) of the substrate 4. The concave section 41 has a function which prevents the movable portion (in detail, the movable mass section 32 and the like) of the sensor element coming into contact with the substrate 4. Thereby, driving of the sensor element 10 is permissible, and it is possible for the substrate 4 to support the sensor element 10.

In addition, as shown in FIG. 4, a first projecting section (projecting section for the first fixed electrode side fixed section) 42a which protrudes from a bottom surface of the concave section 41, a second projecting section (projecting section for the first fixed electrode side fixed section) 42b, two third projecting sections (projecting sections for the first movable electrode side fixed section) 43a, and two fourth projecting sections (projecting sections for the second movable electrode side fixed section) 43b are provided on the upper surface of the substrate 4. Furthermore, four projecting sections 44 and four projecting sections 45 which protrude from the bottom surface of the concave section 41 are provided on the upper surface of the substrate 4.

The first projecting section 42a, the second projecting section 42b, the third projecting section 43a, and the fourth projecting section 43b each have a function of supporting the sensor element 10 in a state where the movable portion of the sensor element 10 is suspended (separated) with respect to the substrate 4.

The connecting section 211a of the first fixed electrode side fixed section 21a described above is joined to the first projecting section 42a. The connecting section 211b of the second fixed electrode side fixed section 21b described above is joined to the second projecting section 42b. The connecting section 311a of the first movable electrode side fixed section 31a described above is joined to two third projecting section 43a. The connecting section 311b of the second movable electrode side fixed section 31b described above is joined to two fourth projecting section 43b.

Four projecting sections 44 and four projecting sections 45 have a function of preventing sticking of a suspended portion (in particular, the movable mass section 32) of the sensor element 10 on the substrate 4.

When described in detail, in planar view, the four projecting sections 44 are disposed at positions which overlap with an outer peripheral section of the movable mass section 32 described above (in further detail, in planar view, four corner sections of the frame section 321 which has an outer shape of a square shape). Thereby, it is possible to effectively reduce sticking of the movable mass section 32 on the substrate 4.

In addition, in planar view, the four projecting sections 45 are disposed at positions which overlap with the movable mass section 32 in the vicinity of a portion (portion in which there is a large electric field during anode adjustment) in which the upper surface of the substrate 4 is exposed from the wiring pattern 5 which will be described later. Thereby, it is possible to effectively reduce sticking of the movable mass section 32 on the substrate 4.

In addition, the configuration material of the substrate 4 is not particularly limited, but it is preferable to use a substrate material which has insulation properties, in detail, it is preferable to use a quartz substrate, a sapphire substrate, and a glass substrate, and in particular, it is preferable to use a glass material (for example, borosilicate glass such as Pyrex glass (registered trademark)) which includes alkali metal ions (movable ions). Thereby, in a case where the sensor element 10 or the lid member 6 is configured of silicon as the main material, it is possible to anodically bond the sensor element 10 and the lid member 6 to the substrate 4.

Here, in the illustrations, the substrate 4 is configured by one member, but may be configured by bonding two or more members. For example, the substrate 4 may be configured by bonding together a member with a frame form and a member with a plate form.

In addition, for example, it is possible to form the substrate 4 using a photolithography method, an etching method, or the like.

Wiring Pattern

As shown in FIG. 6, the wiring pattern 5 is provided on an upper surface of the substrate 4 described above. The wiring pattern 5 has a first fixed electrode side wiring 51a which is electrically connected to the first fixed electrode side fixed section 21a described above, a second fixed electrode side wiring 51b which is electrically connected to the second fixed electrode side fixed section 21b, and movable electrode side wirings 52a, 52b, and 53 which are electrically connected to the movable electrode side fixed section 31.

The first fixed electrode side wiring 51a is disposed extending to the +Y axis direction side from the vicinity of the first projecting section 42a described above. A terminal section on the −Y axis direction side of the first fixed electrode side wiring 51a is connected to the first fixed electrode side fixed section 21a via the first contact section 54a. In addition, the terminal section on the +Y axis direction side of the first fixed electrode side wiring 51a is extracted externally to the package 20 and is electrically connected to an external terminal which is not shown in the drawings. In the same manner, the second fixed electrode side wiring 51b is disposed extending to the −Y axis direction side from the vicinity of the second projecting section 42b described above. A terminal section on the +Y axis direction side of the second fixed electrode side wiring 51b is connected to the second fixed electrode side fixed section 21b via the second contact section 54b. In addition, the terminal section on the −Y axis direction side of the second fixed electrode side wiring 51b is extracted externally to the package 20 and is electrically connected to the external terminal which is not shown in the drawings. Here, a portion which connects to the first contact section 54a of the first fixed electrode side fixed section 21a is able to be said to configure a section of the connecting section 211a which is connected to the substrate of the first fixed electrode side fixed section 21a described above. In the same manner, a portion which connects to the second contact section 54b of the second fixed electrode side fixed section 21b is able to be said to configure a section of the connecting section 211b which is connected to the substrate 4 of the second fixed electrode side fixed section 21b described above.

In planar view, the movable electrode side wirings 52a and 52b are each disposed so as to overlap with the movable mass section 32 of the sensor element 10 as much as possible. The movable electrode side wiring 52a is disposed on the +X axis direction side with respect to the first fixed electrode side wiring 51a and the second fixed electrode side wiring 51b. The movable electrode side wiring 52b is disposed on the −X axis direction side with respect to the first fixed electrode side wiring 51a and the second fixed electrode side wiring 51b.

The movable electrode side wiring 53 has a portion which is disposed between the first projecting section 42a and the second projecting section 42b, and is connected to the movable electrode side wiring 52a and the movable electrode side wiring 52b. Then, the movable electrode side wiring 53 is connected to the first movable electrode side fixed section 31a via a third contact section 55a, and is connected to the second movable electrode side fixed section 31b via a fourth contact section 55b. Here, a portion which connects to the third contact section 55a of the first movable electrode side fixed section 31a is able to be said to configure a section of the connecting section 311a which is connected to the substrate 4 of the first movable electrode side fixed section 31a described above. In the same manner, a portion which connects to the fourth contact section 55b of the second movable electrode side fixed section 31b is able to be said to configure a section of the connecting section 311b which is connected to the substrate 4 of the second movable electrode side fixed section 31b described above.

The configuration material of such a wiring pattern 5 is not particularly limited as long as the configuration material has conductivity, respectively various electrode materials are used, and for example, it is possible to use a transparent electrode material such as indium tin oxide (ITO), zinc oxide (ZnO), a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), zirconium (Zr), and a semiconductor material such as silicon (Si).

In addition, the wiring pattern 5 collectively forms a film on which a material such as described above is formed using a sputtering method and a vapor deposition method such as an evaporation method by patterning using the photolithography method, etching method, and the like. Here, in a case where the substrate 4 is configured by a semiconductor material such as silicon, it is preferable to provide an insulation layer between the substrate 4 and the wiring pattern 5. For example, it is possible to use silicon oxide ($SiO_2$), aluminum nitride (AlN), silicon nitride (SiN), and the like as the configuration material of the insulation layer.

In addition, the respective configuration materials of each contact section are not particularly limited as long as the configuration materials have conductivity, it is possible to use various electrode materials in the same manner as the wiring pattern 5, but for example, it is preferable to use an elemental metal such as Au, Pt, Ag, Cu, and Al, or a metal of alloys or the like which include the elemental metals. It is possible to reduce contact resistance between the wiring pattern 5 and the sensor element 10 by configuring each contact section using such metal.

Lid Member

As shown in FIGS. 2 and 3, the lid member 6 has a function which protects the sensor element 10 described above.

The lid member 6 is joined to the substrate 4 described above, and the space S is formed in which the sensor element 10 is housed within the substrate 4.

When described in detail, the lid member 6 has a plate form, and is provided with a concave section 61 on the upper surface (surface on the sensor element 10 side). The concave section 61 is formed so as to permit displacement of a movable portion of the sensor element 10.

Then, a portion further outside than the concave section 61 on the lower surface of the lid member 6 is joined to the upper surface of the substrate 4 described above. The joining method of the lid member 6 and the substrate 4 is not particularly limited, but, for example, it is possible to use a joining method which uses an adhesive, an anodic bonding method, a direct joining method, and the like.

In addition, as long as it is possible to exhibit the function as described above, the configuration material of the lid member 6 is not particularly limited, but, for example, it is possible to appropriately use a silicon material, a glass material, or the like.

According to the physical quantity sensor 1 as described above, in planar view, it is possible to frame the movable mass section 32, and dispose the first fixed electrode side fixed section 21a and the second fixed electrode side fixed section 21b, and the first movable electrode side fixed section 31a and the second movable electrode side fixed section 31b inside the frame section 321 of the movable mass section 32. Thereby, it is possible to respectively shorten the distance between the first fixed electrode side fixed section 21a and the second fixed electrode side fixed section 21b and a distance between the first movable electrode side fixed section 31a and the second movable electrode side fixed section 31b. In more detail, it is possible to respectively shorten the distance between the connecting section 211a and the connecting section 211b, and the distance between the connecting section 311a and the connecting section 311b. For this reason, even if the substrate 4 is warped accompanying temperature variance, it is possible to reduce a deformation difference between electrode sections. As a result, it is possible to set superior temperature characteristics. Moreover, it is possible to shorten a distance between the first fixed electrode section 213a and the second fixed electrode section 213b by forming the movable mass section 32 as a frame body and disposing the first fixed electrode section 213a and the second fixed electrode section 213b along the Y axis direction which is the same direction as a direction (detection axis direction) in which the movable mass section 32 is displaced. As a result, it is possible further increase sensitivity of the physical quantity sensor 1.

Here, for example, warping of the substrate 4 due to temperature variations occurs due to a linear expansion coefficient difference between the substrate 4 and the sensor element 10 or the lid member 6. For this reason, in particular, in a case where there is such a linear expansion coefficient difference, it is possible to cause an effect in which the temperature characteristics such as described above are improved to remarkably occur.

In addition, as described above, the connecting section 211a of the first fixed electrode side fixed section 21a and the connecting section 211b of the second fixed electrode side fixed section 21b are respectively positioned between the connecting section 311a of the first movable electrode side fixed section 31a and the connecting section 311b of the second movable electrode side fixed section 31b of the in planar view. Then, a separation distance between the connecting section 211a and the connecting section 211b is shorter than a separation distance between the connecting section 311a and the connecting section 311b. That is, the separation distance between the first movable electrode side fixed section 31a and the second movable electrode side fixed section 31b is longer than the separation distance between the first fixed electrode side fixed section 21a and the second fixed electrode side fixed section 21b.

Thereby, when the substrate 4 is warped in the Y axis direction, it is possible to reduce reception of the influence of warping of the substrate 4 by the first fixed electrode side fixed section 21a and the second fixed electrode side fixed section 21b. As a result, it is possible to set superior temperature characteristics.

In addition, in the physical quantity sensor 1, since each first movable electrode finger 3221a, each second movable electrode finger 3221b, each first fixed electrode fingers 2131a, and each second fixed electrode finger 2131b extend along the X axis direction which is orthogonal with respect to the detection axis direction, it is possible to increase electrostatic capacity change respectively between the first fixed electrode section 213a and the first movable electrode section 322a and between the second fixed electrode section 213b and the second movable electrode section 322b accompanying displacement of the movable mass section 32. For this reason, it is possible to design the physical quantity sensor 1 with high sensitivity.

In addition, since the first extending section 212a and the second extending section 212b respectively extend along the Y axis direction which is the detection axis direction, it is possible to effectively increase the number of each of the first movable electrode fingers 3221a, the second movable electrode fingers 3221b, the first fixed electrode fingers 2131a, and the second fixed electrode fingers 2131b. For this reason, it is possible to further increase electrostatic capacity change respectively between the first fixed electrode section 213a and the first movable electrode section 322a and between the second fixed electrode section 213b and the second movable electrode section 322b accompanying displacement of the movable mass section 32.

In addition, as described above, the first extending section 212a is disposed on one side in the Y axis direction with respect to the first movable electrode side fixed section 31a and the second movable electrode side fixed section 31b, and the second extending section 212b is disposed on another side in the Y axis direction with respect to the first movable electrode side fixed section 31a and the second movable electrode side fixed section 31b. Thereby, as described above, it is possible to reduce noise by carrying out a differential calculation of a signal according to electrostatic capacity change between the first fixed electrode section 213a and the first movable electrode section 322a and a signal according to electrostatic capacity change between the second fixed electrode section 213b and the second movable electrode section 322b.

In addition, in planar view, the first extending section 212a has a portion which overlaps with the first fixed electrode side wiring 51a which is electrically connected to the first fixed electrode fingers 2131a. In the same manner, in planar view, the second extending section 212b has a portion which overlaps with the second fixed electrode side wiring 51b which is electrically connected to the second fixed electrode fingers 2131b. Here, the first extending section 212a and the first fixed electrode side wiring 51a have the same potential as each other, and in addition, the second extending section 212b and the second fixed electrode side wiring 51b have the same potential as each other. For this reason, it is possible to reduce parasitic capacitance which occurs between the substrate 4 and the first extending section 212a and the second extending section 212b due to the first extending section 212a and the first fixed electrode side wiring 51a overlapping in planar view and the second extending section 212b and the second fixed electrode side wiring 51b overlapping in planar view. As a result, it is possible to set a superior detection characteristic of the physical quantity sensor 1.

In addition, in planar view, a tip end section of the first movable electrode fingers 3221a overlaps with the movable electrode side wiring 52a which is electrically connected to the first movable electrode fingers 3221a, and a tip end section of the second movable electrode fingers 3221b overlaps with the movable electrode side wiring 52b which is electrically connected to the second movable electrode fingers 3221b. Thereby, for example, when the sensor element 10 which is a structure that includes the first fixed electrode side fixed section 21a and the second fixed electrode side fixed section 21b and the substrate 4 are anodically bonded, the tip end section of the first movable electrode fingers 3221a face the movable electrode side wiring 52a with the same potential, and the tip end section of the second movable electrode fingers 3221b face the movable electrode side wiring 52b with the same potential. For this reason, during anodical bonding, a field is reduced which is generated between the tip end section of the first movable electrode fingers 3221a and the second movable electrode fingers 3221b and the substrate 4, and as a result, it is possible to prevent or reduce sticking of each first movable electrode finger 3221a and each second movable electrode finger 3221b on the substrate 4.

In addition, as described above, both the connecting section 311a of the first movable electrode side fixed section 31a and the connecting section 311b of the second movable electrode side fixed section 31b are connected to the movable electrode side wiring 53. Thereby, it is possible to perform electrical contact between the movable electrode side structure 3 which is a structure that includes the first movable electrode side fixed section 31a and the second movable electrode side fixed section 31b that have the same potential as each other and the movable electrode side wiring 53 at a plurality of locations using the first contact section 54a and the second contact section 54b. For this reason, it is possible to increase contact reliability.

In addition, as described above, the conductive first contact section 54a is provided in contact with both the connecting section 311a and the movable electrode side wiring 53 therebetween, the conductive second contact section 54b is provided in contact with both the connecting section 311b and the movable electrode side wiring 53 therebetween. Thereby, it is possible to increase reliability of electrical contact between the movable electrode side structure 3 and the movable electrode side wiring 53.

In addition, as described above, a plurality of projecting sections 44 and the plurality of projecting sections 45 are provided overlapping with the movable mass section 32 in planar view on the main surface of the substrate 4. Thereby, it is possible to regulate movement in an out-of-plane direction of the movable mass section 32 using the projecting sections 44 and 45, and as a result, it is possible to prevent or reduce sticking of the movable mass section 32 on the substrate 4.

In addition, as described above, the elastic section 33 has a first elastic section 33a which is connected to the first movable electrode side fixed section 31a and the movable mass section 32 in which the movable mass section 32 is displaceable in the Y axis direction and a second elastic section 33b which is connected to the second movable electrode side fixed section 31b and the movable mass section 32 in which the movable mass section 32 is displaceable in the Y axis direction. It is possible to more stably support the movable mass section 32 using such an elastic section 33. For this reason, it is possible to improve a characteristic of the physical quantity sensor 1.

In addition, as described above, the first support section 312a has a portion which extends in the +X axis direction from the connecting section 311a, and the second support section 312b has a portion which extends in the −X axis direction from the connecting section 311b. For this reason, it is possible to increase a distance between a connecting portion of the first support section 312a and the first elastic section 33a and a connecting portion of the second support section 312b and the second elastic section 33b. For this reason, it is possible to reduce displacement in the out-of-plane direction (Z axis direction) of the movable mass section 32 and reduce torsional vibration within the surface on which the out-of-plane direction is set as an axis. For this reason, it is possible to improve impact resistance of the physical quantity sensor 1.

Second Embodiment

Figure 7:
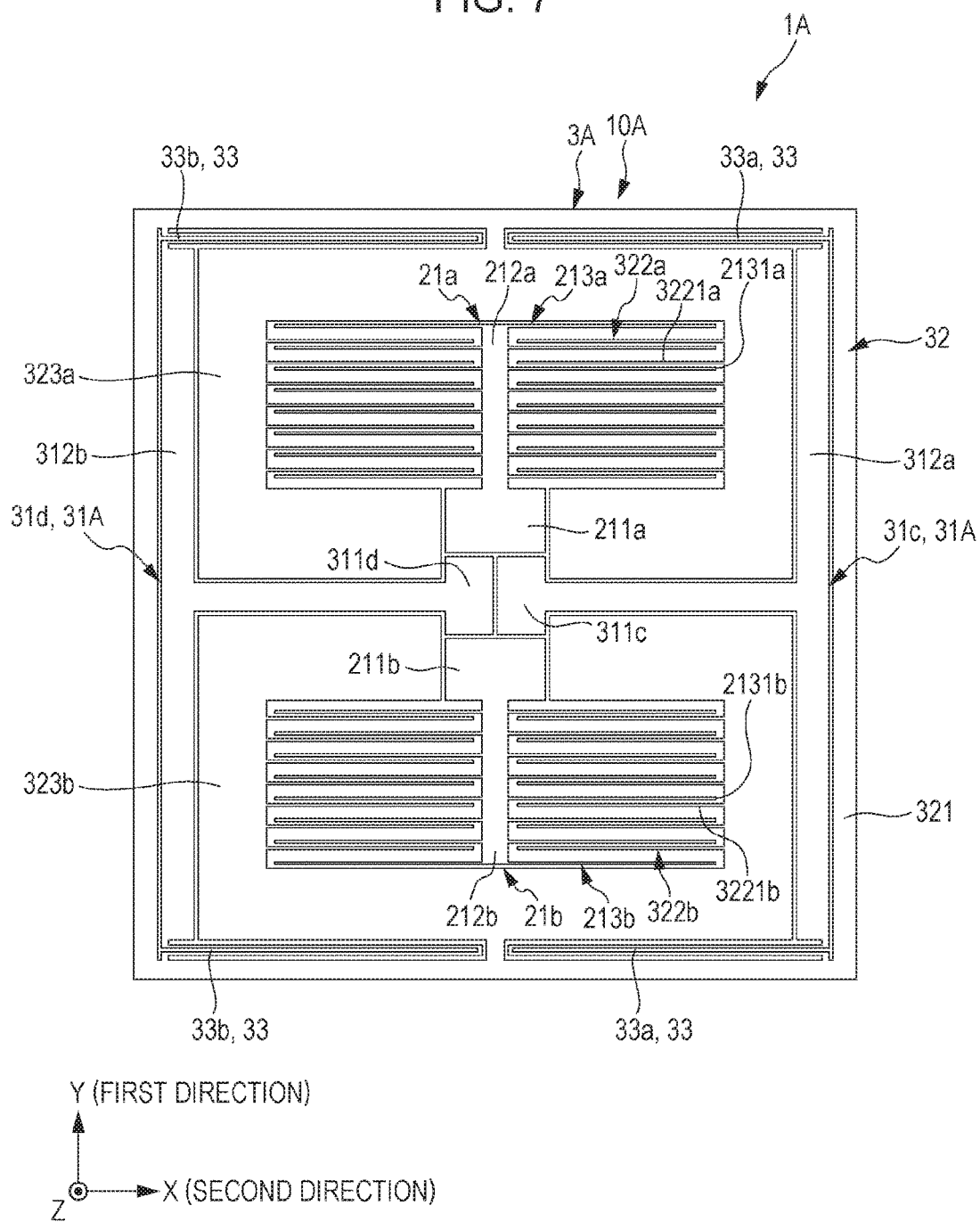
FIG. 7 is a planar view illustrating a physical quantity sensor according to a second embodiment of the invention.

FIG. 7 is a planar view of the physical quantity sensor according to a second embodiment of the invention.

The physical quantity sensor according to the embodiment, is the same as the physical quantity sensor according to the first embodiment described above other than that the disposition of the connecting section of the first fixed electrode side fixed section, the connecting section of the second fixed electrode side fixed section, the connecting section of the first movable electrode side fixed section, and the connecting section of the second movable electrode side fixed section is different.

Here, the description below relates to the second embodiment, the description focuses on the differences from the embodiment described above, and similar matter is omitted from the description. In addition, in FIG. 7, the configuration which is the same as the first embodiment described above is given the same reference numerals.

As shown in FIG. 7, a sensor element 10A which a physical quantity sensor 1A has of the embodiment has the first fixed electrode side fixed section 21a, the second fixed electrode side fixed section 21b, and a movable electrode side structure 3A. The movable electrode side structure 3A has a first movable electrode side fixed section 31A which has a first movable electrode side fixed section 31c and a second movable electrode side fixed section 31d, the movable mass section 32, and the elastic section 33.

The first movable electrode side fixed section 31c has a connecting section 311c which is connected to the substrate 4 and a first support section 312a which connects to the connecting section 311c. In the same manner, a second movable electrode side fixed section 31d has a connecting section 311d which is connected to the substrate 4 and a second support section 312b which connects to the connecting section 311d.

In the embodiment, in planar view, the connecting section 311c and the connecting section 311d are positioned between the connecting section 211a which the first fixed electrode side fixed section 21a has and the connecting section 211b which the second fixed electrode side fixed section 21b has. Then, a separation distance between the connecting section 311c and the connecting section 311d is shorter than a separation distance between the connecting section 211a and the connecting section 211b. That is, the separation distance between the first movable electrode side fixed section 31c and the second movable electrode side fixed section 31d is shorter than the separation distance between the first fixed electrode side fixed section 21a and the second fixed electrode side fixed section 21b. Thereby, when the substrate 4 is warped in the X axis direction, it is possible to reduce reception of the influence of warping of the substrate 4 by the first movable electrode side fixed section 31c and the second movable electrode side fixed section 31d. As a result, it is possible to set superior temperature characteristics.

It is possible to realize superior temperature characteristics also using the physical quantity sensor 1A according to the second embodiment as described above.

Third Embodiment

FIG. 8 is a planar view illustrating the physical quantity sensor according to a third embodiment of the invention.

The physical quantity sensor according to the embodiment is the same as the physical quantity sensor according to the first embodiment described above other than that the configuration of the movable electrode side fixed section is different.

Here, the description below relates to the third embodiment, the description focuses on the differences from the embodiments described above, and similar matter is omitted from the description. In addition, in FIG. 8, the configuration which is the same as the first embodiment described above is given the same reference numerals.

Sensor Element 10B

As shown in FIG. 8, a sensor element 10B which a physical quantity sensor 1B has of the embodiment has the first fixed electrode side fixed section 21a, the second fixed electrode side fixed section 21b, and a movable electrode side structure 3B. The movable electrode side structure 3B has a movable electrode side fixed section 31B, the movable mass section 32, and the elastic section 33.

The movable electrode side fixed section 31B has a first movable electrode side fixed section 31e which is disposed on the +X axis direction side with respect to the center of the sensor element 10B, a second movable electrode side fixed section 31f which is disposed on the −X axis direction side with respect to the center of the sensor element 10B, and a linking section 34 which links a first movable electrode side fixed section 31e and a second movable electrode side fixed section 31f. The first movable electrode side fixed section 31e, the second movable electrode side fixed section 31f, and the linking section 34 are integrally formed.

The first movable electrode side fixed section 31e has a base section 311e which is connected to the substrate 4 and a first support section 312a which is connected to the base section 311e. In the same manner, the second movable electrode side fixed section 31f has a base section 311f which is connected to the substrate 4 and a second support section 312b which is connected to the base section 311f.

In planar view, the linking section 34 passes through a center of gravity O32 of the movable mass section 32, passes the connecting section 211*a* which the first fixed electrode side fixed section 21*a* has and the connecting section 211*b* which the second fixed electrode side fixed section 21*b* has, extends along the Y axis direction, and connects the base section 311*e* and the base section 311*f*. In other words, in planar view, the movable electrode side fixed section 31B is provided with a portion (linking section 34) which is positioned between the connecting section 211*a* which the first fixed electrode side fixed section 21*a* has and the connecting section 211*b* which the second fixed electrode side fixed section 21*b* has. It is possible to reduce the occurrence of a potential difference between the first movable electrode side fixed section 31*e* and the second movable electrode side fixed section 31*f*, and realize stable sensor characteristics by providing such a linking section 34.

Substrate 4B

The first projecting section (projecting section for the first fixed electrode side fixed section) 42*a*, the second projecting section (projecting section for the first fixed electrode side fixed section) 42*b*, and one third projecting section (projecting section for the first movable electrode side fixed section) 43*c* are provided on the upper surface of the substrate 4B.

The first projecting section 42*a*, the second projecting section 42*b*, and the third projecting section 43*c* each have a function of supporting the sensor element 10B in a state where the movable portion of the sensor element 10B is suspended (separated) with respect to the substrate 4B.

The connecting section 211*a* is joined to the first projecting section 42*a*, and the connecting section 211*b* is joined to the second projecting section 42*b*.

The linking section 34 of the movable electrode side fixed section 31B described above is joined to the third projecting section 43*c*. That is, the linking section 34 has a function as a connecting section which is connected to the third projecting section 43*c*.

In the embodiment, as described above, the linking section 34 is positioned on the center of gravity O32 of the movable mass section 32, and the linking section 34 is connected to the substrate 4B. In this manner, in planar view, it is possible to further reduce reception of the influence of warping of the substrate 4B by the movable electrode side fixed section 31B due to it being possible to dispose on the substrate 4B in the linking section 34 which is disposed on the center of gravity O32 or in the vicinity of the center of gravity O32. As a result, it is possible to set superior temperature characteristics.

In particular, as described above, in planar view, the linking section 34 (section of the movable electrode side fixed section 31B) is easily disposed on the center of gravity O32 or in the vicinity of the center of gravity O32 of the movable mass section 32 by positioning the linking section 34 between the connecting section 211*a* and the connecting section 211*b*. As a result, as described above, it is possible to further improve temperature characteristics.

It is possible to realize superior temperature characteristics also by the physical quantity sensor 1B according to the third embodiment as described above.

Fourth Embodiment

FIG. 9 is a planar view illustrating a physical quantity sensor according to the fourth embodiment of the invention.

The physical quantity sensor according to the embodiment is the same as the physical quantity sensor according to the first embodiment described above other than that the configuration of the connecting section 211*a* of the first fixed electrode side fixed section 21*a*, the connecting section 211*b* of the second fixed electrode side fixed section 21*b*, the connecting section 311*a* of the first movable electrode side fixed section 31*a*, and the connecting section 311*b* of the second movable electrode side fixed section 31*b* is different.

Here, the description below relates to the fourth embodiment, the description focuses on the differences from the embodiment described above, and similar matter is omitted from the description. In addition, in FIG. 9, the configuration which is the same as the first embodiment described above is given the same reference numerals.

As shown in FIG. 9, a sensor element 10C which a physical quantity sensor 1C has of the embodiment has the first fixed electrode side fixed section 21*c*, the second fixed electrode side fixed section 21*d*, and a movable electrode side structure 3C. The movable electrode side structure 3C has a movable electrode side fixed section 31C which has a first movable electrode side fixed section 31*g* and the second movable electrode side fixed section 31*h*, the movable mass section 32, and the elastic section 33.

The first fixed electrode side fixed section 21*c* has a connecting section 211*c* which is connected to the substrate 4, the first extending section 212*a* which extends from the connecting section 211*c*, and the first fixed electrode section 213*a* which is connected to the first extending section 212*a*. In the same manner, the second fixed electrode side fixed section 21*d* has the connecting section 211*d* which is connected to the substrate 4, the second extending section 212*b* which extends from the connecting section 211*d*, and the second fixed electrode section 213*b* which is connected to the second extending section 212*b*.

The first movable electrode side fixed section 31*g* has a connecting section 311*g* which is connected to the substrate 4 and a first support section 312*a* which connects to the connecting section 311*g*. In the same manner, the second movable electrode side fixed section 31*h* has a connecting section 311*h* which is connected to the substrate 4 and a second support section 312*b* which connects to the connecting section 311*h*.

In the embodiment, in planar view, the connecting sections 211*c*, 211*d*, 311*g*, and 311*h* are disposed lined up along the X axis direction in order of the connecting section 311*h*, the connecting section 211*c*, the connecting section 211*d*, and the connecting section 311*g* from the −X axis direction side to the +X axis direction side. Even with the disposition of such connecting sections 211*c*, 211*d*, 311*g*, and 311*h*, in the same manner as the first embodiment described above, it is possible to respectively shorten the distance between the connecting section 211*c* and the connecting section 211*d* and the distance between the connecting section 311*g* and the connecting section 311*h*. For this reason, even if the substrate 4 is warped accompanying temperature variance, the influence of warping of the substrate 4 which is received by the sensor element is reduced, and as a result, it is possible to set superior temperature characteristics. In particular, it is possible to reduce reception of the influence of warping of the substrate 4 in the Y axis direction by the first movable electrode side fixed section 31*g* and the second movable electrode side fixed section 31*h*.

It is possible to realize superior temperature characteristics also by the physical quantity sensor 1C according to the fourth embodiment as described above.

2. Electronic Device

Subsequently, an electronic device in which the physical quantity sensor 1 is used will be described in detail based on FIGS. 10 to 12.

Figure 10:
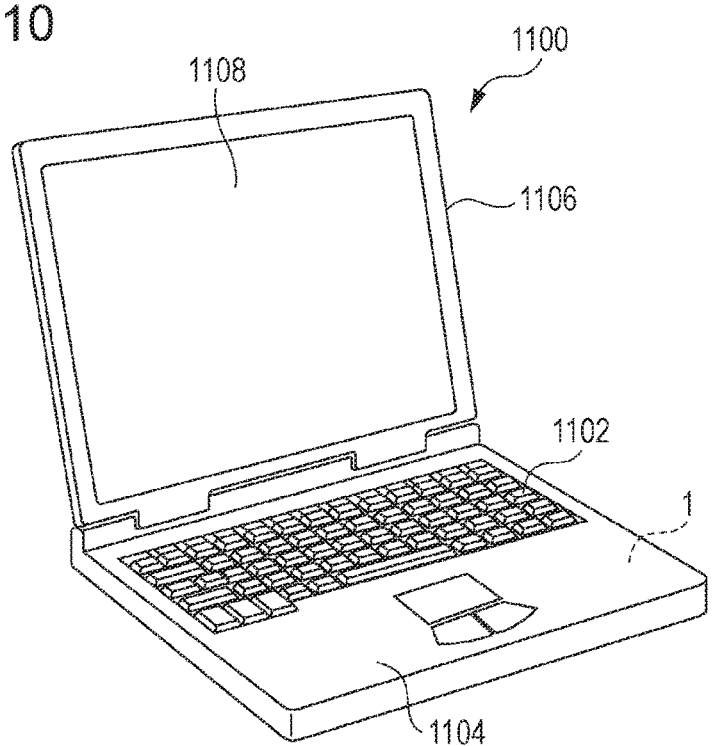
FIG. 10 is a perspective view schematically illustrating a configuration of a mobile type personal computer which is an example of an electronic device in the invention.

FIG. 10 is a perspective view schematically illustrating a configuration of a mobile type personal computer which is an example of an electronic device in the invention.

In the drawing, a personal computer 1100 is configured by a main body section 1104 which is provided with a keyboard 1102, and a display unit 1106 which is provided with a display section 1108, and the display unit 1106 is supported so as to be able to rotate via a hinge structure section with respect to the main body section 1104. The physical quantity sensor 1 which functions as a gyro sensor is built in to such a personal computer 1100.

Figure 11:
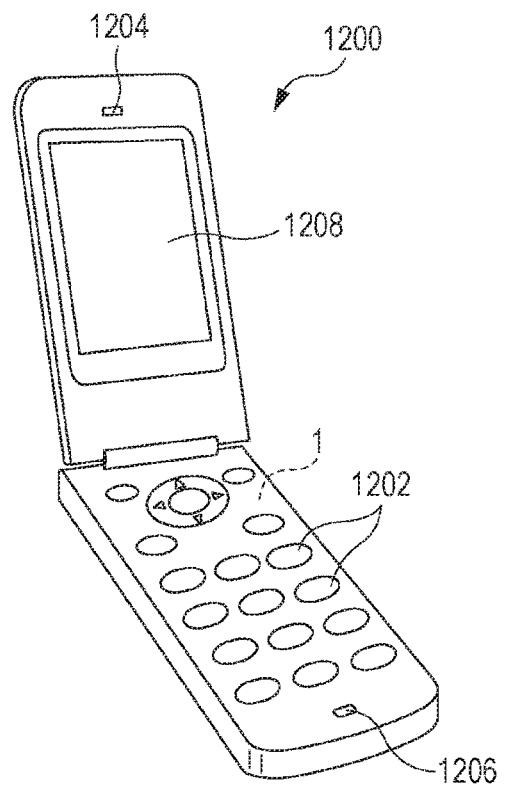
FIG. 11 is a perspective view schematically illustrating a configuration of a mobile phone which is an example of the electronic device in the invention.

FIG. 11 is a perspective view schematically illustrating a configuration of a mobile phone which is an example of the electronic device in the invention.

In the drawing, a mobile phone 1200 is provided with a plurality of operation buttons 1202, a receiving port 1204, and a transmission port 1206, and a display section 1208 is disposed between the operation buttons 1202 and the receiving port 1204. The physical quantity sensor 1 which functions as the gyro sensor is built in to such a mobile phone 1200.

Figure 12:
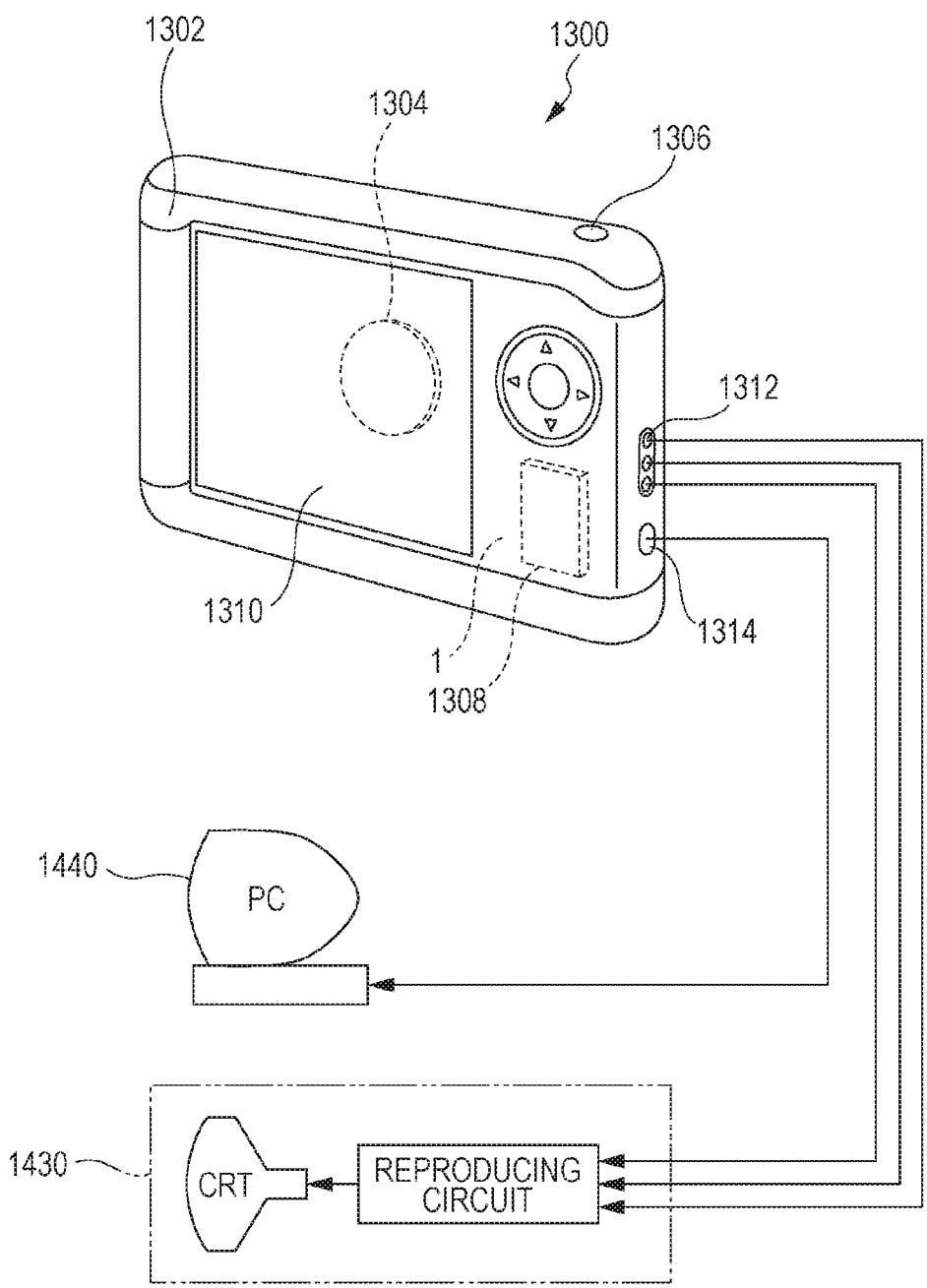
FIG. 12 is a perspective view illustrating a configuration of a digital still camera which is an example of the electronic device of the invention.

FIG. 12 is a perspective view illustrating a configuration of a digital still camera which is an example of the electronic device of the invention. Here, the drawing also illustrates the connection of an external device in a simplified manner. Here, a normal camera, with respect to photosensitizing a silver halide photographic film using an optical image of a subject, and a digital still camera 1300 generate an imaging signal (image signal) by carrying out photoelectric conversion on an optical image of a subject using an imaging element such as a charge coupled device (CCD).

The display section is provided on the rear surface of a case (body) 1302 in the digital still camera 1300, and is configured to perform display based on the imaging signal using the CCD, and the display section 1310 functions as a viewfinder which displays a subject as an electronic image.

In addition, a light-receiving unit 1304 which includes an optical lens (imaging optical system), a CCD, and the like are provided at the front surface side (the rear surface side in the drawing) of the case 1302.

A subject image which is displayed on the display section is confirmed by a photographer, and at the point in time when a shutter button 1306 is pressed down, the imaging signal of the CCD is transferred and stored in a memory 1308.

In addition, a video signal output terminal 1312 and an input and output terminal 1314 for data communication are provided on a side surface of the case 1302 in the digital still camera 1300. Then, as illustrated, a television monitor 1430 is connected to the video signal output terminal 1312, or a personal computer 1440 is connected to the input and output terminal 1314 for data communication respectively according to need. Furthermore, using a predetermined operation, the imaging signal which is stored in the memory 1308 is configured so as to be output to the television monitor 1430 or the personal computer 1440.

The physical quantity sensor 1 which functions as the gyro sensor is built in to such a digital still camera 1300.

Here, in addition to the personal computer in FIG. 10 (mobile-type personal computer), the mobile phone in FIG. 11, and the digital still camera in FIG. 12, it is also possible to apply the electronic device which is provided with the physical quantity sensor of the invention to, for example, a smartphone, a tablet terminal, a timepiece, an ink jet-type discharging apparatus (for example, an ink jet printer), a laptop-type personal computer, a television, a video camera, a video tape recorder, a car navigation device, a pager, an electronic organizer (including those having a communication function), an electronic dictionary, an electronic calculator, an electronic game device, a word processor, a work station, a video phone, a television monitor for crime prevention, a pair of electronic binoculars, a POS terminal, medical equipment (for example, an electronic thermometer, a blood pressure meter, a blood glucose meter, an electrocardiographic measuring device, an ultrasonic diagnostic device, or an electronic endoscope), a fish finder, various measurement equipment, an instrument (for example, an instrument for a vehicle, an aircraft, or a ship), a flight simulator, and the like.

3. Mobile Body

Subsequently, a mobile body in which the physical quantity sensor 1 is used will be described in detail based on FIG. 13.

Figure 13:
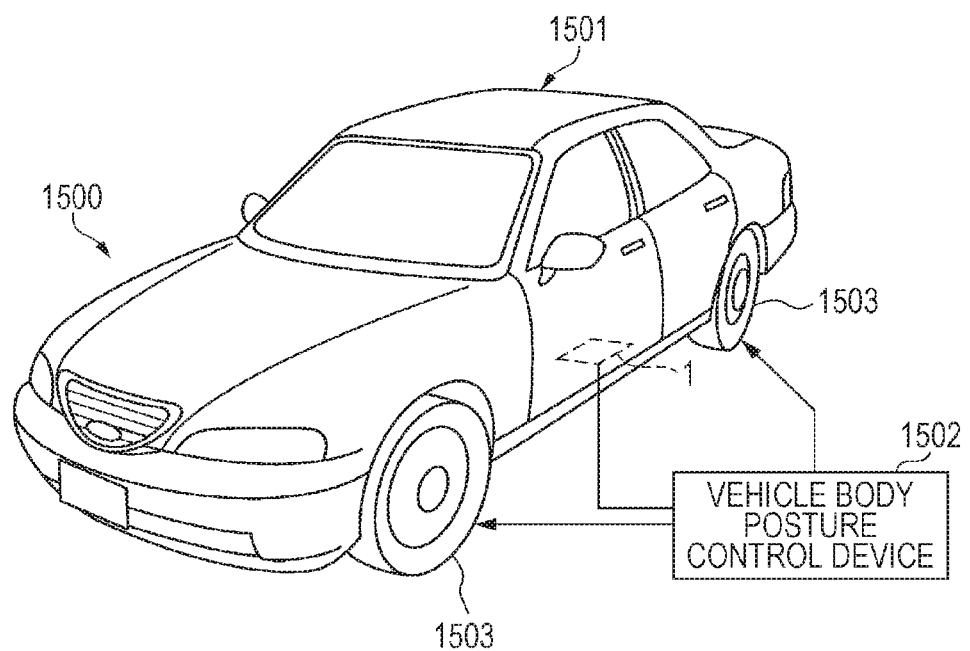
FIG. 13 is a perspective view illustrating a configuration of an automobile which is an example of a mobile body of the invention.

FIG. 13 is a perspective view illustrating a configuration of an automobile which is an example of a mobile body of the invention.

The physical quantity sensor 1 which functions as the gyro sensor is built in to an automobile 1500, and it is possible to detect the posture of a vehicle 1501 using the physical quantity sensor 1. The detection signal of the physical quantity sensor 1 is supplied to a vehicle body posture control device 1502, the vehicle body posture control device 1502 detects the posture of the vehicle 1501 based on the detection signal, and according to the detection result, it is possible to control the hardness of suspension, or control brakes of individual wheels 1503. In addition, such posture control is able to be utilized in a biped walking robot and a radio controlled helicopter. As above, posture control is realized in various mobile bodies, and the physical quantity sensor 1 is incorporated.

The physical quantity sensor, the electronic device, and the mobile body of the invention are described above based on the embodiments of the drawings, but the invention is not limited thereto, and it is possible for the configuration of each section to be substituted with an arbitrary configuration which has the same function. In addition, other arbitrary constructions may be added to the invention.

The entire disclosure of Japanese Patent Application No. 2015-138780, filed Jul. 10, 2015 is expressly incorporated by reference herein.

What is claimed is:

1. A physical quantity sensor comprising:
    a movable electrode support that fixes a movable electrode to a substrate, the movable electrode support being configured with first and second movable electrode supports, the movable electrode being configured with first and second movable electrodes;
    a first fixed electrode that is configured with a plurality of first fixed electrode fingers, each of the plurality of first fixed electrode fingers extending in an X direction;
    a first fixed electrode support to which the plurality of first fixed electrode fingers are connected, the first fixed electrode support extending in a Y direction perpendicular to the X direction;
    a second fixed electrode that is configured with a plurality of second fixed electrode fingers, each of the plurality of second fixed electrode fingers extending in the X direction;
    a second fixed electrode support to which the plurality of second fixed electrode fingers are connected, the second fixed electrode support extending in the Y direction;
    a frame-shaped movable mass that is configured with a movable mass frame, the first movable electrode, the second movable electrode, the first movable electrode support, and the second movable electrode support, the first movable electrode being configured with a plurality of first movable electrode fingers extending in the X direction, the second movable electrode being configured with a plurality of second movable electrode fingers extending in the X direction, the plurality of first movable electrode fingers being connected to the first movable electrode support, the plurality of second movable electrode fingers being connected to the second movable electrode support, the first and second fixed electrode fingers and the first and second movable electrode fingers being located directly adjacent to each other; and an elastic member that physically connects the movable electrode support and the frame-shaped movable mass such that the frame-shaped movable mass is displaceable along the Y direction, wherein the movable mass frame completely encloses the first and second movable electrode supports, the first and second movable electrodes, the first and second fixed electrodes, the first and second fixed electrode supports, and the elastic member in a plan view.

2. The physical quantity sensor according to claim 1, wherein when a linear line is drawn along the X direction to pass through a center of the frame-shaped moveable mass so as to divide an inner area of the movable mass frame into first and second inner areas, the first fixed electrode support is located in the first inner area and the second fixed electrode support is located in the second inner area.

3. The physical quantity sensor according to claim 1, further comprising:
a first fixed electrode wiring that is provided on the substrate and that is electrically connected to the first fixed electrode fingers; and
a second fixed electrode wiring that is provided on the substrate and that is electrically connected to the second fixed electrode fingers,
wherein the first fixed electrode support partially overlaps with the first fixed electrode wiring in the plan view, and
the second fixed electrode support partially overlaps with the second fixed electrode wiring in the plan view.

4. The physical quantity sensor according to claim 3, further comprising:
a projection that projects from a main surface of the substrate so as to overlap with the frame-shaped movable mass in the plan view.

5. The physical quantity sensor according to claim 1, wherein each of the first and second movable electrode supports has first and second main members that are continuously formed with each other, and
the first main member extends along the X direction, and the second main member extends along the Y direction.

6. The physical quantity sensor according to claim 5, wherein a minimum distance between the first and second movable electrode supports is shorter than a minimum distance between the first and second fixed electrode supports.

7. The physical quantity sensor according to claim 5, wherein a minimum distance between the first and second movable electrode supports is longer than a minimum distance between the first and second fixed electrode supports.

8. The physical quantity sensor according to claim 5, wherein the elastic member is configured with a first elastic section and a second elastic section, the first elastic section is directly connected to the first movable electrode support and the frame-shaped movable mass such that the frame-shaped movable mass is displaceable along the Y direction, and
the second elastic section is directly connected to the second movable electrode support and the frame-shaped movable mass such that the frame-shaped movable mass is displaceable along the Y direction.

9. The physical quantity sensor according to claim 1, wherein the elastic member is configured with a first elastic section and a second elastic section, the first elastic section is directly connected to the first movable electrode support and the frame-shaped movable mass such that the frame-shaped movable mass is displaceable along the Y direction, and
the second elastic section is directly connected to the second movable electrode support and the frame-shaped movable mass such that the frame-shaped movable mass is displaceable along the Y direction.

10. The physical quantity sensor according to claim 1, wherein the movable electrode support is sandwiched between the first fixed electrode support and the second fixed electrode support along the Y direction in the plan view.

11. The physical quantity sensor according to claim 1, wherein the movable electrode support is overlapped with a center of the frame-shaped movable mass in the plan view.

12. An electronic device comprising:
the physical quantity sensor according to claim 1;
a display configured to display an image; and
a case that houses the physical quantity sensor and the display.

13. An electronic device comprising:
the physical quantity sensor according to claim 4;
a display configured to display an image; and
a case that houses the physical quantity sensor and the display.

14. An electronic device comprising:
the physical quantity sensor according to claim 5;
a display configured to display an image; and
a case that houses the physical quantity sensor and the display.

15. An electronic device comprising:
the physical quantity sensor according to claim 2;
a display configured to display an image; and
a case that houses the physical quantity sensor and the display.

16. An electronic device comprising:
the physical quantity sensor according to claim 3;
a display configured to display an image; and
a case that houses the physical quantity sensor and the display.

17. A mobile object comprising:
the physical quantity sensor according to claim 1; and
a movable body that houses the physical quantity sensor.

18. A mobile object comprising:
the physical quantity sensor according to claim 2; and
a movable body that houses the physical quantity sensor.

19. A mobile object comprising:
the physical quantity sensor according to claim 3; and
a movable body that houses the physical quantity sensor.

20. A mobile object comprising:
the physical quantity sensor according to claim 4; and
a movable body that houses the physical quantity sensor.

* * * * *